(12) United States Patent
Wu et al.

(10) Patent No.: US 11,810,919 B2
(45) Date of Patent: Nov. 7, 2023

(54) SEMICONDUCTOR DEVICE STRUCTURE WITH CONDUCTIVE VIA STRUCTURE AND METHOD FOR FORMING THE SAME

(71) Applicant: Taiwan Semiconductor Manufacturing Company, Ltd., Hsinchu (TW)

(72) Inventors: Jyun-De Wu, New Taipei (TW); Te-Chih Hsiung, Taipei (TW); Yi-Chun Chang, Hsinchu (TW); Yi-Chen Wang, Zhubei (TW); Yuan-Tien Tu, Chiayi County (TW); Peng Wang, Hsinchu (TW); Huan-Just Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 126 days.

(21) Appl. No.: 17/350,171

(22) Filed: Jun. 17, 2021

(65) Prior Publication Data

US 2022/0406777 A1    Dec. 22, 2022

(51) Int. Cl.
*H01L 21/8234*    (2006.01)
*H01L 29/66*    (2006.01)
*H01L 27/092*    (2006.01)
*H01L 29/78*    (2006.01)

(52) U.S. Cl.
CPC .. *H01L 27/0924* (2013.01); *H01L 21/823418* (2013.01); *H01L 21/823431* (2013.01); *H01L 29/66795* (2013.01); *H01L 29/7851* (2013.01)

(58) Field of Classification Search
None
See application file for complete search history.

(56) References Cited

U.S. PATENT DOCUMENTS

| | | | |
|---|---|---|---|
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 8/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |

(Continued)

*Primary Examiner* — Joseph C. Nicely
*Assistant Examiner* — Lamont B Koo
(74) *Attorney, Agent, or Firm* — Birch, Stewart, Kolasch & Birch, LLP

(57) ABSTRACT

A semiconductor device structure is provided. The semiconductor device structure includes a substrate having a first fin structure. The semiconductor device structure includes a first source/drain structure over the first fin structure. The semiconductor device structure includes a first dielectric layer over the first source/drain structure and the substrate. The semiconductor device structure includes a first conductive contact structure in the first dielectric layer and over the first source/drain structure. The semiconductor device structure includes a second dielectric layer over the first dielectric layer and the first conductive contact structure. The semiconductor device structure includes a first conductive via structure passing through the second dielectric layer and connected to the first conductive contact structure. The first conductive via structure has a first substantially strip shape in a top view of the first conductive via structure.

20 Claims, 24 Drawing Sheets

(56) References Cited

U.S. PATENT DOCUMENTS

| | | |
|---|---|---|
| 9,236,300 B2 | 1/2016 | Liaw |
| 9,520,482 B1 | 12/2016 | Chang et al. |
| 9,576,814 B2 | 2/2017 | Wu et al. |
| 2016/0233164 A1* | 8/2016 | Choi .................. H01L 29/41791 |
| 2019/0080969 A1* | 3/2019 | Tsao .................... H01L 23/5286 |
| 2020/0091146 A1* | 3/2020 | Tsao .................... H01L 27/0886 |
| 2020/0105938 A1* | 4/2020 | Yang ................. H01L 29/66545 |

* cited by examiner

SEMICONDUCTOR DEVICE STRUCTURE WITH CONDUCTIVE VIA STRUCTURE AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 2A-1 is a cross-sectional view illustrating the semiconductor device structure along a sectional line I-I' in FIG. 2A, in accordance with some embodiments.

FIG. 2A-2 is a cross-sectional view illustrating the semiconductor device structure along a sectional line II-II' in FIG. 2A, in accordance with some embodiments.

FIG. 2A-3 is a cross-sectional view illustrating the semiconductor device structure along a sectional line in FIG. 2A, in accordance with some embodiments.

FIG. 2A-4 is a cross-sectional view illustrating the semiconductor device structure along a sectional line IV-IV' in FIG. 2A, in accordance with some embodiments.

FIG. 2B-1 is a cross-sectional view illustrating the semiconductor device structure along a sectional line I-I' in FIG. 2B, in accordance with some embodiments.

FIG. 2C-1 is a cross-sectional view illustrating the semiconductor device structure along a sectional line I-I' in FIG. 2C, in accordance with some embodiments.

FIG. 2D-1 is a cross-sectional view illustrating the semiconductor device structure along a sectional line I-I' in FIG. 2D, in accordance with some embodiments.

FIG. 2E-1 is a cross-sectional view illustrating the semiconductor device structure along a sectional line I-I' in FIG. 2E, in accordance with some embodiments.

FIG. 2F-1 is a cross-sectional view illustrating the semiconductor device structure along a sectional line I-I' in FIG. 2F, in accordance with some embodiments.

FIG. 2G-1 is a cross-sectional view illustrating the semiconductor device structure along a sectional line I-I' in FIG. 2G, in accordance with some embodiments.

FIG. 2G-2 is a cross-sectional view illustrating the semiconductor device structure along a sectional line II-II' in FIG. 2G, in accordance with some embodiments.

FIG. 2G-3 is a cross-sectional view illustrating the semiconductor device structure along a sectional line III-III' in FIG. 2G, in accordance with some embodiments.

FIG. 2G-4 is a cross-sectional view illustrating the semiconductor device structure along a sectional line IV-IV' in FIG. 2G, in accordance with some embodiments.

FIG. 4 is a top view of a semiconductor device structure, in accordance with some embodiments.

DETAILED DESCRIPTION

Figure 1:
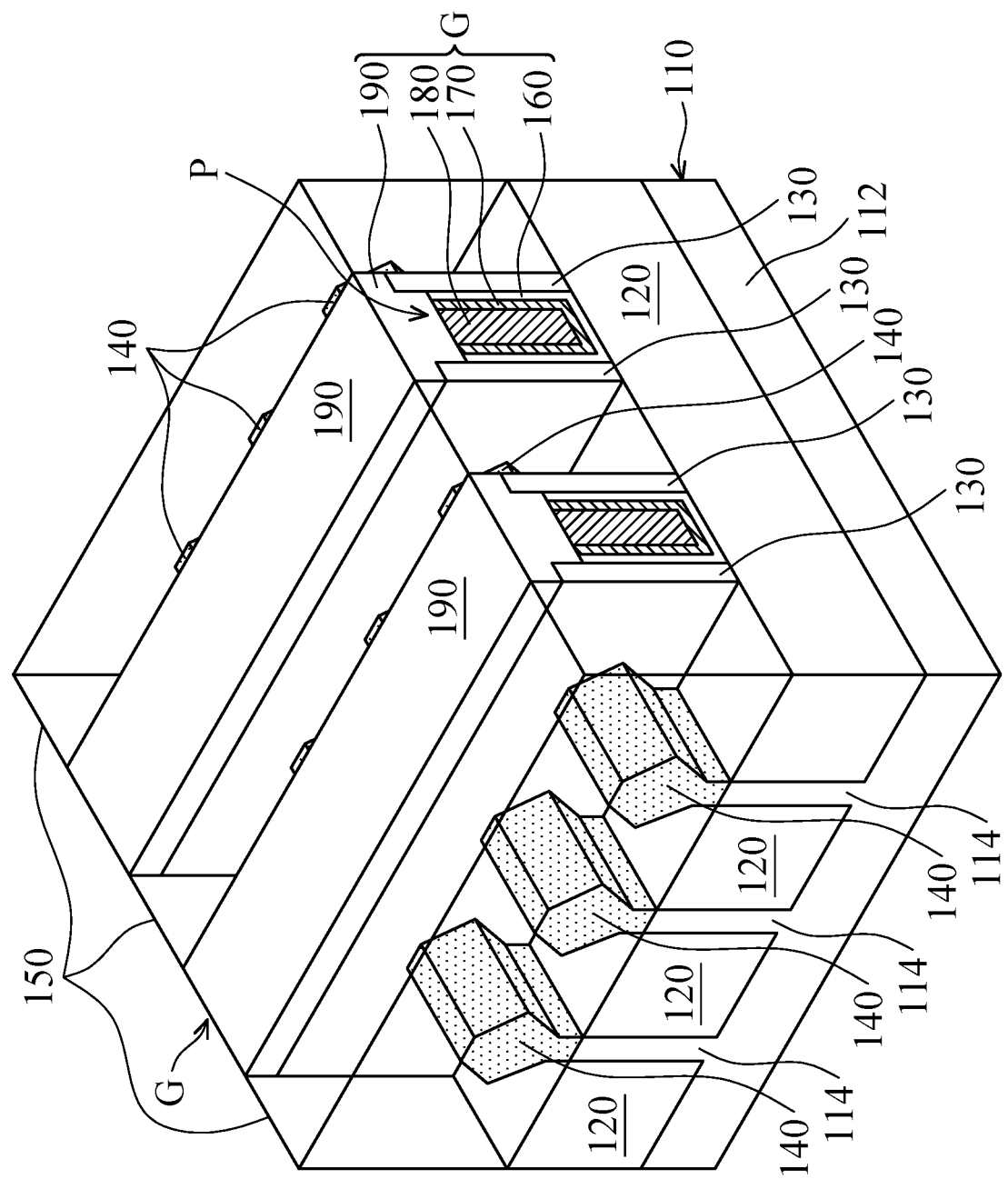
FIG. 1 is a perspective view of a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. The term "substantially" may be varied in different technologies and be in the deviation range understood by the skilled in the art. For example, the term "substantially" may also relate to 90% of what is specified or higher, such as 95% of what is specified or higher, especially 99% of what is specified or higher, including 100% of what is specified, though the present invention is not limited thereto. Furthermore, terms such as "substantially parallel" or "substantially perpendicular" may be interpreted as not to exclude insignificant deviation from the specified arrangement and may include for example deviations of up to 10°. The word "substantially" does not exclude "completely" e.g. a composition which is "substantially free" from Y may be completely free from Y.

The term "about" may be varied in different technologies and be in the deviation range understood by the skilled in the art. The term "about" in conjunction with a specific distance or size is to be interpreted so as not to exclude insignificant deviation from the specified distance or size. For example, the term "about" may include deviations of up to 10% of what is specified, though the present invention is not limited thereto. The term "about" in relation to a numerical value x may mean x±5 or 10% of what is specified, though the present invention is not limited thereto.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure form a semiconductor device structure with FinFETs. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 2A:
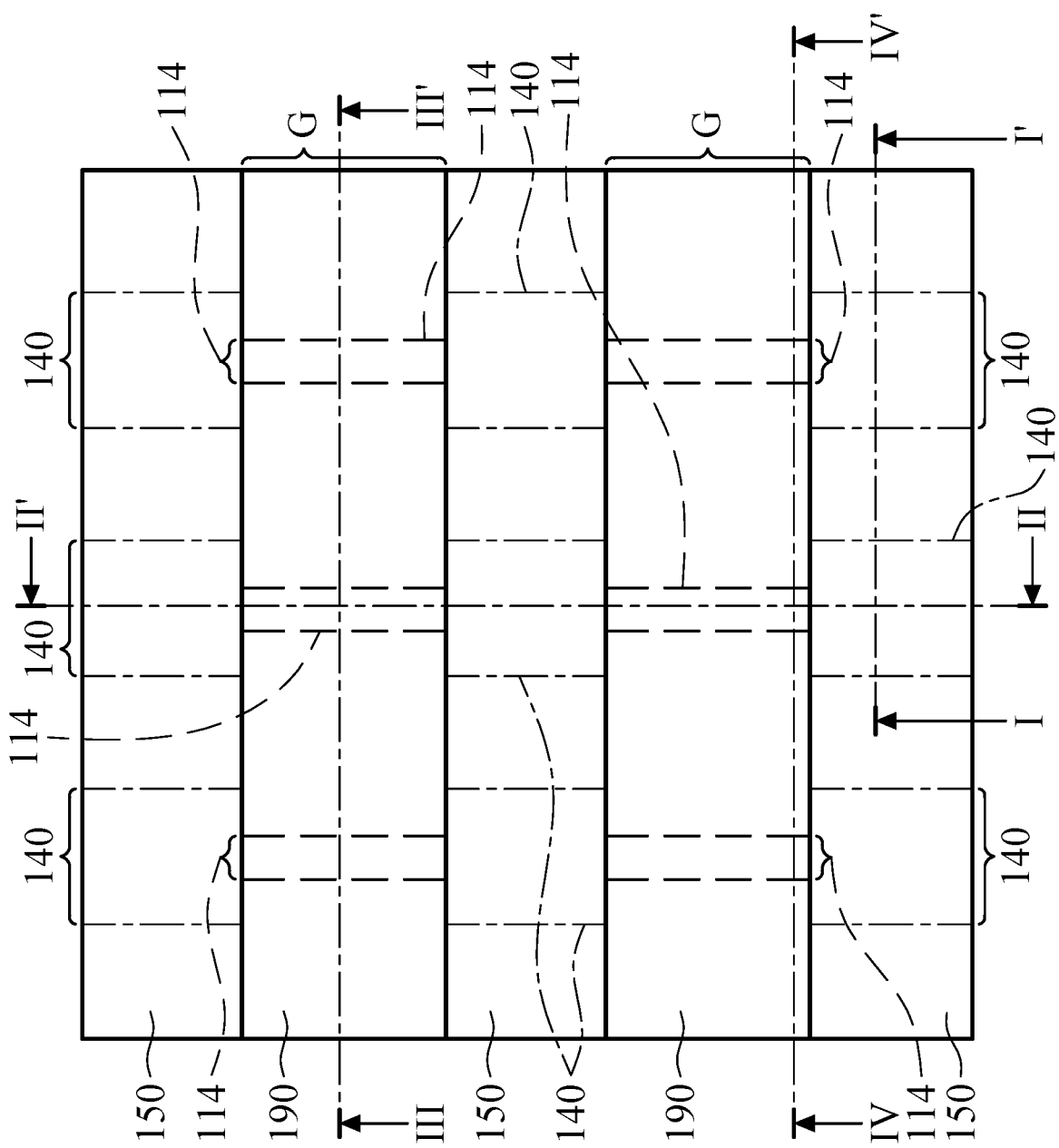
FIGS. 2A-2G are top views of various stages of a process for forming a semiconductor device structure, in accordance with some embodiments.
Figures 1, 2A:
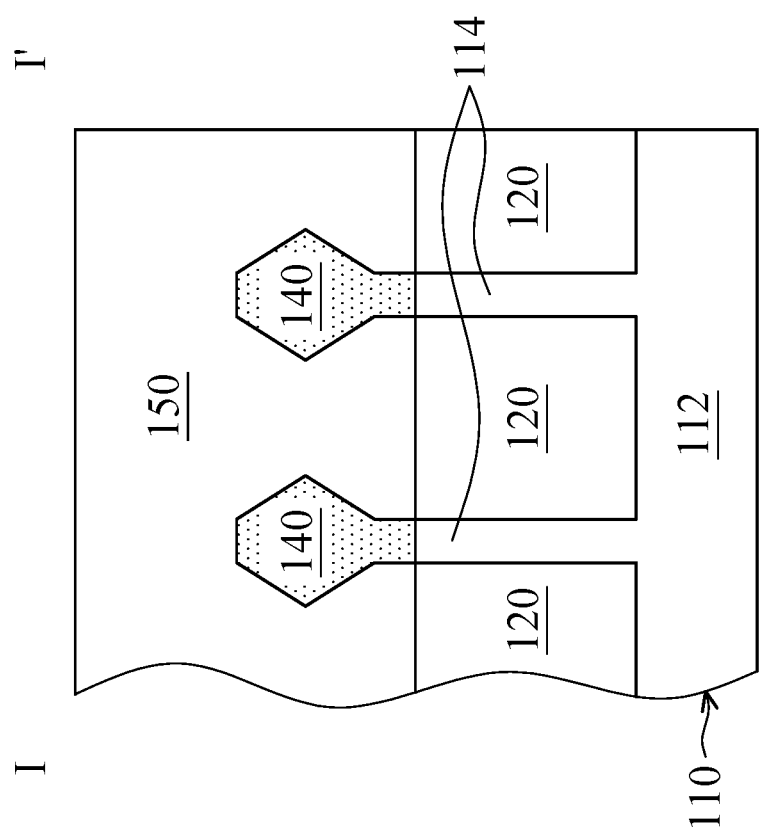

FIG. 1 is a perspective view of a semiconductor device structure, in accordance with some embodiments. FIGS. 2A-2G are top views of various stages of a process for forming a semiconductor device structure, in accordance with some embodiments. FIG. 2A-1 is a cross-sectional view illustrating the semiconductor device structure along a sectional line I-I' in FIG. 2A, in accordance with some embodiments.

Figures 2, 2A:
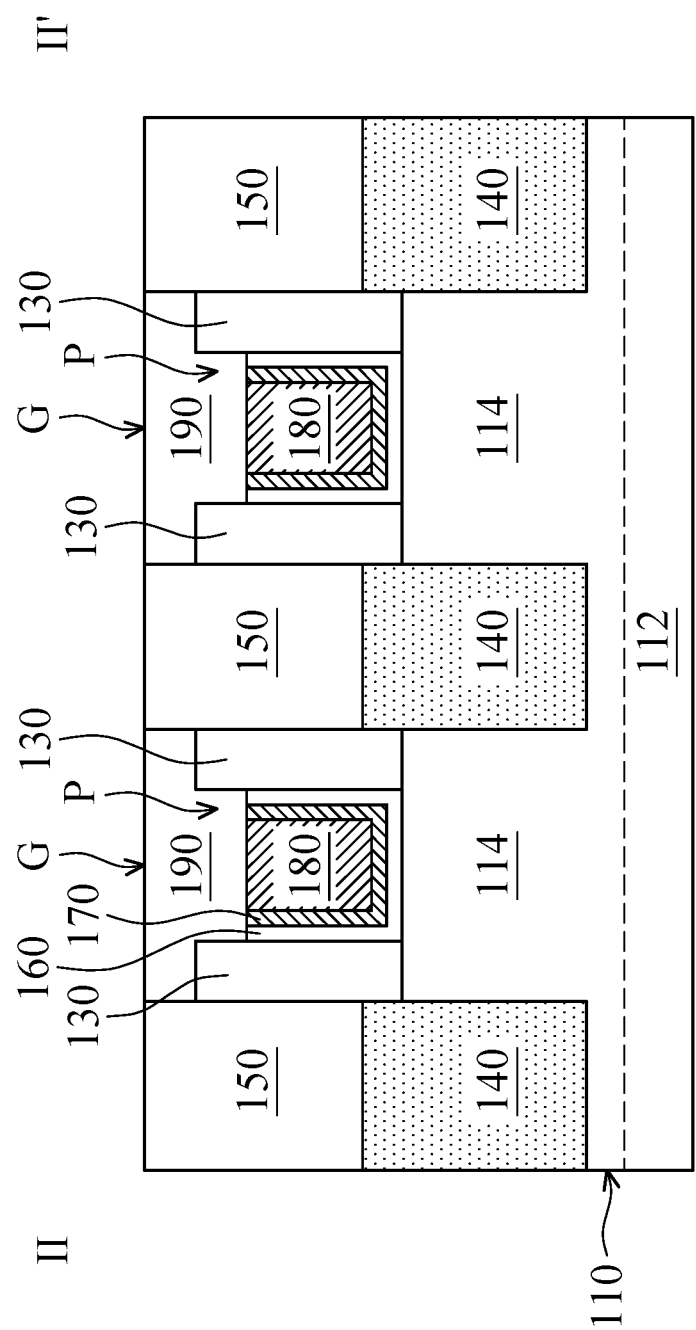
Figures 2, 2A, 3:
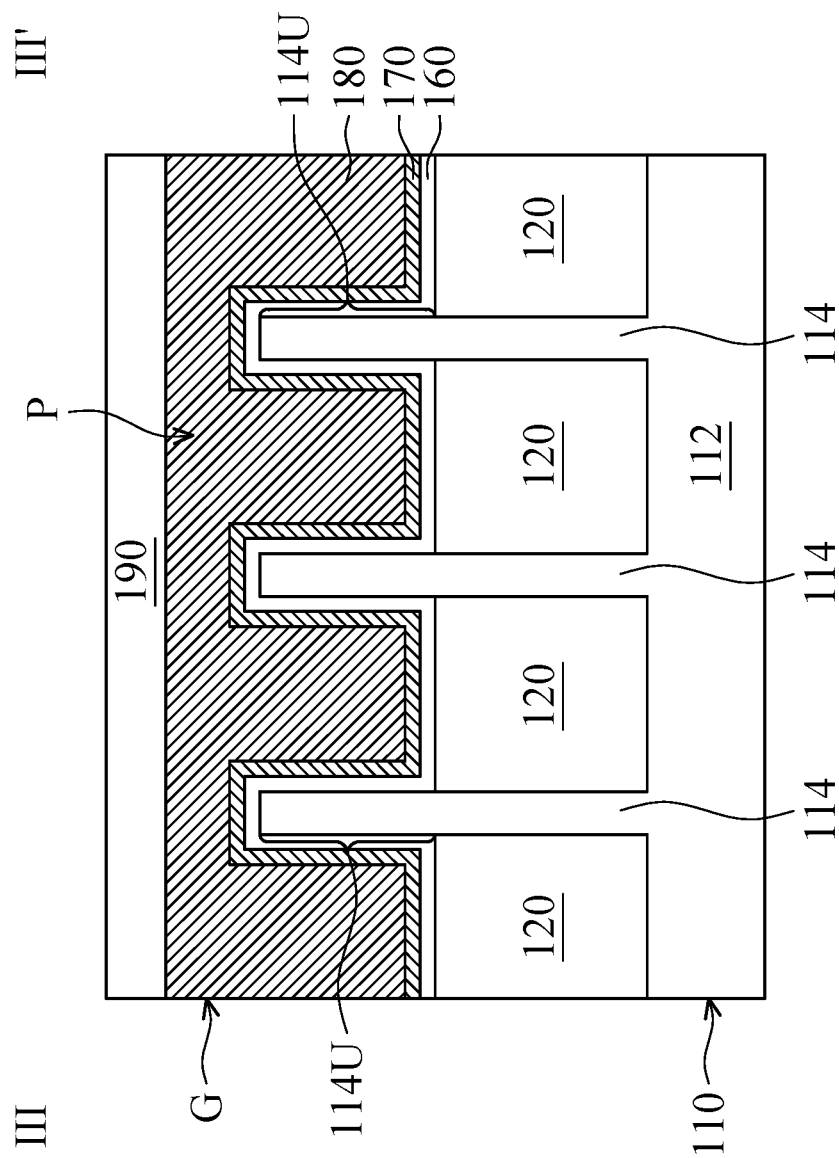

FIG. 2A-2 is a cross-sectional view illustrating the semiconductor device structure along a sectional line II-II' in FIG. 2A, in accordance with some embodiments. FIG. 2A-3 is a cross-sectional view illustrating the semiconductor device structure along a sectional line III-III' in FIG. 2A, in accordance with some embodiments. FIG. 2A-4 is a cross-sectional view illustrating the semiconductor device structure along a sectional line IV-IV' in FIG. 2A, in accordance with some embodiments.

As shown in FIGS. 1, 2A, 2A-1, and 2A-2, a substrate 110 is provided, in accordance with some embodiments. The substrate 110 has a base portion 112 and fin structures 114, in accordance with some embodiments. The fin structures 114 are over the base portion 112, in accordance with some embodiments. The substrate 110 includes, for example, a semiconductor substrate. The substrate 110 includes, for example, a semiconductor wafer (such as a silicon wafer) or a portion of a semiconductor wafer.

In some embodiments, the substrate 110 is made of an elementary semiconductor material including silicon or germanium in a single crystal structure, a polycrystal structure, or an amorphous structure. In some other embodiments, the substrate 110 is made of a compound semiconductor, such as silicon carbide, gallium arsenide, gallium phosphide, indium phosphide, indium arsenide, an alloy semiconductor, such as SiGe or GaAsP, or a combination thereof. The substrate 110 may also include multi-layer semiconductors, semiconductor on insulator (SOI) (such as silicon on insulator or germanium on insulator), or a combination thereof.

In some embodiments, the substrate 110 is a device wafer that includes various device elements. In some embodiments, the various device elements are formed in and/or over the substrate 110. The device elements are not shown in figures for the purpose of simplicity and clarity. Examples of the various device elements include active devices, passive devices, other suitable elements, or a combination thereof. The active devices may include transistors or diodes (not shown) formed at a surface of the substrate 110. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the substrate 110. The isolation features are used to surround active regions and electrically isolate various device elements formed in and/or over the substrate 110 in the active regions. In some embodiments, the isolation features include shallow trench isolation (STI) features, local oxidation of silicon (LOCOS) features, other suitable isolation features, or a combination thereof.

As shown in FIGS. 1 and 2A-1, an isolation layer 120 is formed over the base portion 112, in accordance with some embodiments. The isolation layer 120 is between the fin structures 114, in accordance with some embodiments. The isolation layer 120 is made of an insulating material, such as oxide (such as silicon oxide), fluorosilicate glass (FSG), a low-k dielectric material, and/or another suitable insulating material. The isolation layer 120 may be deposited by an atomic layer deposition (ALD) process, a chemical vapor deposition (CVD) process, or another applicable process.

As shown in FIGS. 1, 2A and 2A-2, spacers 130 are formed over the isolation layer 120 and the fin structures 114, in accordance with some embodiments. As shown in FIGS. 1, 2A and 2A-4, the spacers 130 wrap around upper portions 114U of the fin structures 114, in accordance with some embodiments.

The spacers 130 are single-layered structures or multi-layered structures, in accordance with some embodiments. The spacers 130 are made of an insulating material, such as silicon nitride, silicon oxide, silicon carbide, silicon oxynitride, or another applicable insulating material.

As shown in FIGS. 1, 2A, 2A-1, and 2A-2, source/drain structures 140 are formed over the fin structures 114, in accordance with some embodiments. The source/drain structures 140 include epitaxial structures, in accordance with some embodiments. In some embodiments, the source/drain structures 140 are made of an N-type conductivity material, in accordance with some embodiments.

The N-type conductivity material includes silicon phosphorus (SiP) or another suitable N-type conductivity material. The source/drain structures 140 are doped with the Group VA element, in accordance with some embodiments. The Group VA element includes phosphor (P), antimony (Sb), or another suitable Group VA material.

In some other embodiments, the source/drain structures 140 are made of a P-type conductivity material, in accordance with some embodiments. The P-type conductivity material includes silicon germanium (SiGe) or another suitable P-type conductivity material. The source/drain structures 140 are doped with the Group IIIA element, in accordance with some embodiments. The Group IIIA element includes boron or another suitable material. The source/drain structures 140 are formed using an epitaxial process, in accordance with some embodiments.

As shown in FIG. 1, a dielectric layer 150 is formed over the source/drain structures 140 and the isolation layer 120, in accordance with some embodiments. For the sake of clarity, the source/drain structures 140, the isolation layer 120, and the spacers 130 covered by the dielectric layer 150 are shown using solid lines in FIG. 1, in accordance with some embodiments. The dielectric layer 150 is made of oxide, such as silicon oxide (e.g., $SiO_2$), in accordance with some embodiments.

As shown in FIGS. 1 and 2A-2, two adjacent spacers 130 are spaced apart by a gap P, in accordance with some embodiments. The gap P partially exposes the fin structure 114 thereunder, in accordance with some embodiments. As shown in FIGS. 1, 2A-2, and 2A-3, a gate dielectric layer 160 is formed to cover bottoms of the gaps P, in accordance with some embodiments. The gate dielectric layer 160 is made of a dielectric material, such as a high dielectric constant (high-k) material, in accordance with some embodiments.

The high-k material is made of hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), another suitable high-k dielectric material, or a combination thereof, in accordance with some embodiments.

In some embodiments, the high-k material is made of metal oxides, metal nitrides, metal silicates, transition metal-oxides, transition metal-nitrides, transition metal-silicates, oxynitrides of metals, aluminum oxide, hafnium dioxide-alumina ($HfO_2$—$Al_2O_3$) alloy, other suitable materials, or a combination thereof.

As shown in FIGS. 1, 2A-2, and 2A-3, a work function metal layer 170 is deposited over the gate dielectric layer 160, in accordance with some embodiments. The work function metal layer 170 provides a desired work function for transistors to enhance device performance including improved threshold voltage.

In the embodiments of forming an NMOS transistor, the work function metal layer 170 can be an n-type metal capable of providing a work function value suitable for the device, such as equal to or less than about 4.5 eV. The n-type metal may be made of metal, metal carbide, metal nitride, or a combination thereof. For example, the n-type metal is made of tantalum, tantalum nitride, or a combination thereof.

On the other hand, in the embodiments of forming a PMOS transistor, the work function metal layer 170 can be a p-type metal capable of providing a work function value suitable for the device, such as equal to or greater than about 4.8 eV. The p-type metal may be made of metal, metal carbide, metal nitride, another suitable material, or a combination thereof. For example, the p-type metal is made of titanium, titanium nitride, hafnium, zirconium, titanium, tantalum, aluminum, hafnium carbide, zirconium carbide, aluminides, ruthenium, another suitable material, or a combination thereof.

As shown in FIGS. 1, 2A-2, and 2A-3, a gate electrode layer 180 (also called a metal gate electrode layer) is deposited over the work function metal layer 170, in accordance with some embodiments. The gate electrode layer 180 is made of a suitable metal material, such as aluminum, tungsten, gold, platinum, cobalt, another suitable metal, an alloy thereof, or a combination thereof, in accordance with some embodiments.

As shown in FIGS. 1, 2A-2, and 2A-3, a protection layer 190 is formed over the spacers 130, the gate dielectric layer 160, the work function metal layer 170, and the gate electrode layer 180, in accordance with some embodiments. The protection layer 190 is made of a dielectric material, such as a nitrogen-containing material (e.g., silicon nitride), in accordance with some embodiments.

The gate dielectric layer 160, the work function metal layer 170, the gate electrode layer 180, and the protection layer 190 in or over the same gap P together form a gate stack G, in accordance with some embodiments. As shown in FIGS. 1 and 2A-2, each gate stack G is between two adjacent spacers 130, in accordance with some embodiments. The source/drain structures 140 are over opposite sides of each gate stack G, in accordance with some embodiments. As shown in FIG. 2A-3, the gate stacks G wrap around the upper portions 114U of the fin structures 114, in accordance with some embodiments.

Figures 2, 2A, 3, 4:
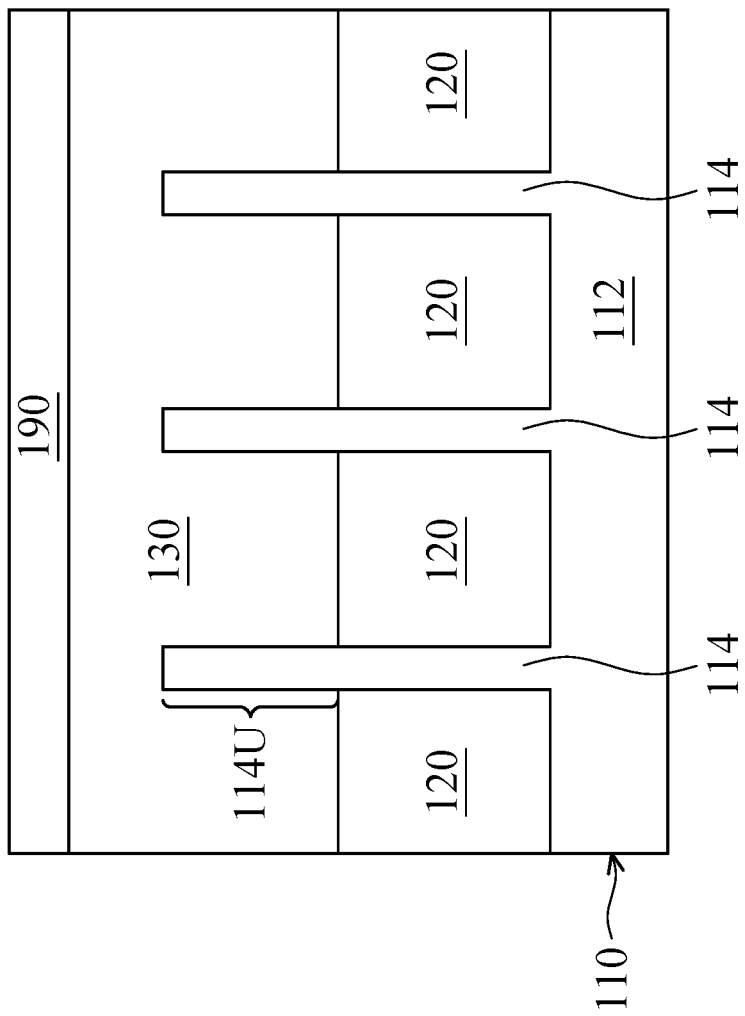
Figure 2B:
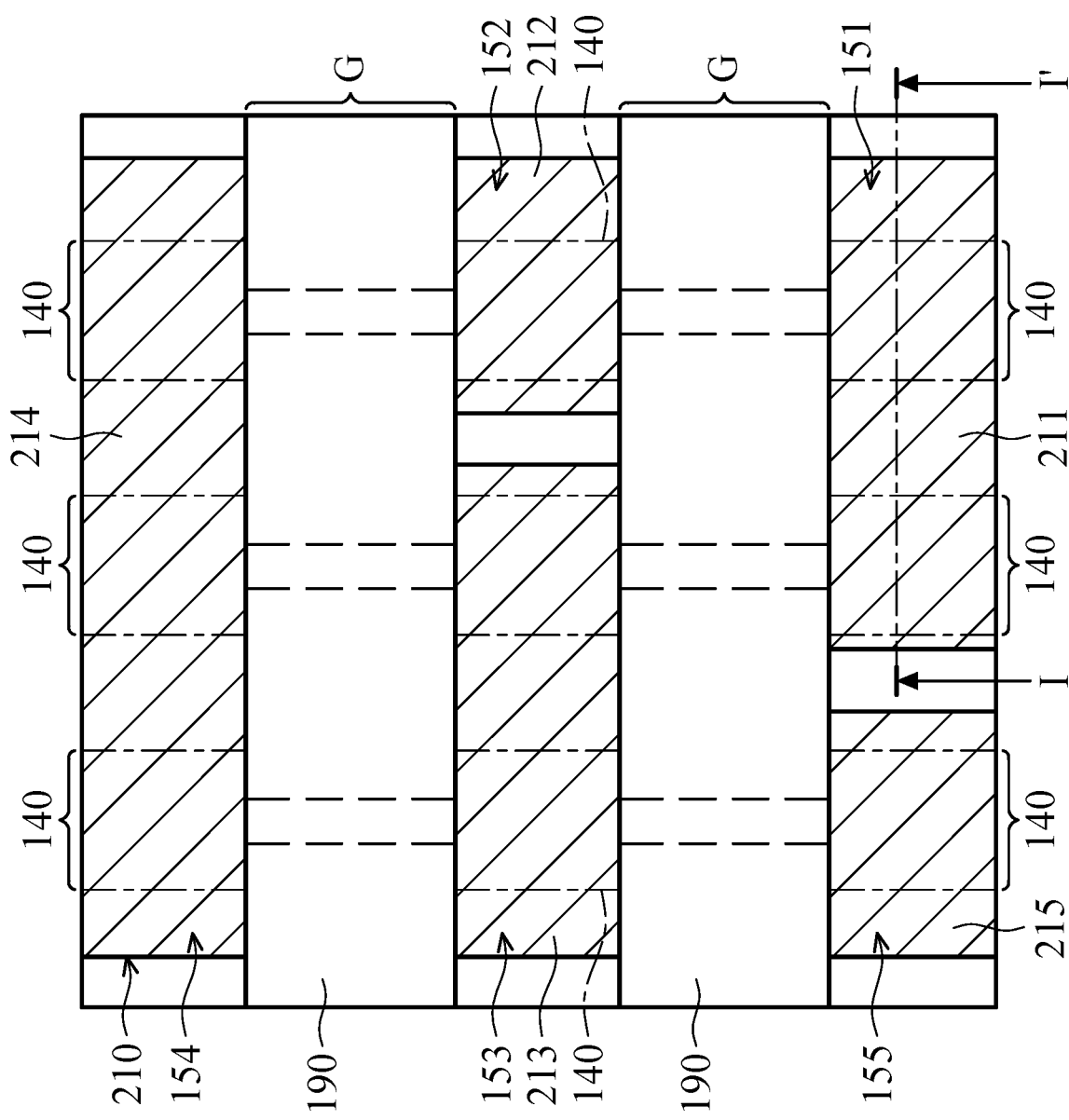
Figures 1, 2B:
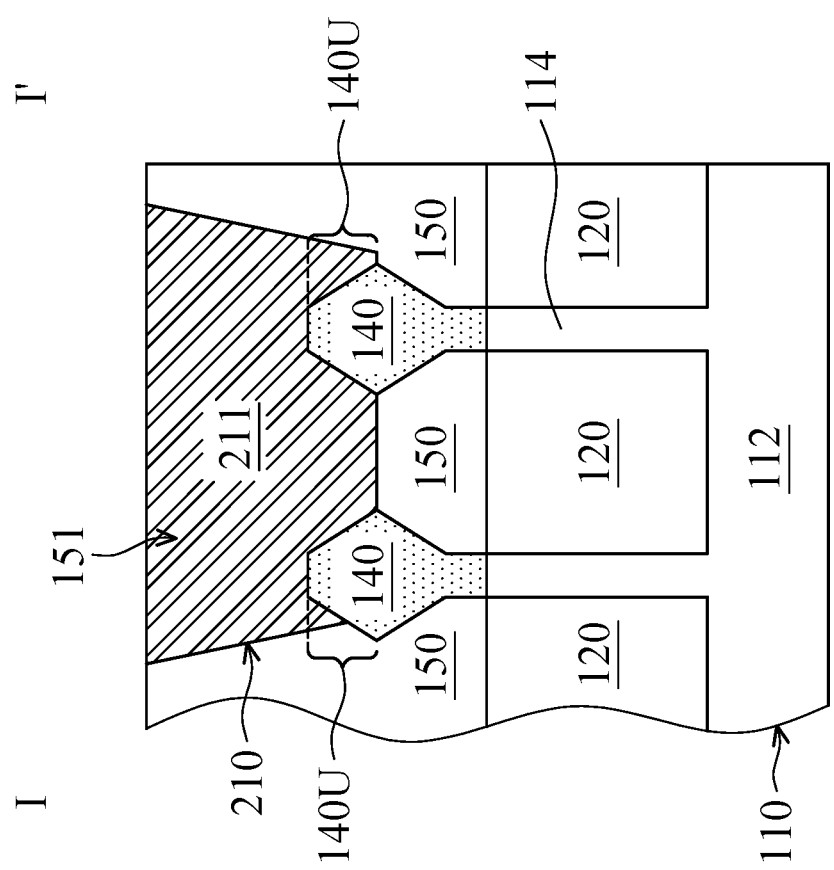

FIG. 2B-1 is a cross-sectional view illustrating the semiconductor device structure along a sectional line I-I' in FIG. 2B, in accordance with some embodiments. Afterwards, as shown in FIGS. 2B and 2B-1, the dielectric layer 150 is partially removed to form recesses 151, 152, 153, 154, and 155, in accordance with some embodiments. The recesses 151, 152, 153, 154, and 155 respectively expose the source/drain structures 140 thereunder, in accordance with some embodiments.

Specifically, the recess 151 exposes two adjacent source/drain structures 140 thereunder, in accordance with some embodiments. The recess 152 exposes one source/drain structure 140 thereunder, in accordance with some embodiments. The recess 153 exposes two adjacent source/drain structures 140 thereunder, in accordance with some embodiments. The recess 154 exposes three adjacent source/drain structures 140 thereunder, in accordance with some embodiments. The recess 155 exposes one source/drain structure 140 thereunder, in accordance with some embodiments.

The removal process includes a photolithography process and an etching process, in accordance with some embodiments. The etching process includes an anisotropic etching process, such as a dry etching process, in accordance with some embodiments.

Thereafter, as shown in FIGS. 2B and 2B-1, a conductive contact layer 210 is formed in the recesses 151, 152, 153, 154, and 155, in accordance with some embodiments. The conductive contact layer 210 includes conductive contact structures 211, 212, 213, 214, and 215, in accordance with some embodiments.

The conductive contact structure 211 is in the recess 151, in accordance with some embodiments. The conductive contact structure 212 is in the recess 152, in accordance with some embodiments. The conductive contact structure 213 is in the recess 153, in accordance with some embodiments. The conductive contact structure 214 is in the recess 154, in accordance with some embodiments. The conductive contact structure 215 is in the recess 155, in accordance with some embodiments.

The conductive contact structures 211, 212, 213, 214, and 215 are over the source/drain structures 140, in accordance with some embodiments. The conductive contact structures 211, 212, 213, 214, and 215 are electrically connected to the source/drain structures 140 thereunder, in accordance with some embodiments.

The conductive contact structures 211, 212, 213, 214, and 215 are in direct contact with the source/drain structures 140 thereunder, in accordance with some embodiments. The conductive contact structures 211, 212, 213, 214, and 215 respectively wrap around upper portions 140U of the source/drain structures 140 thereunder, in accordance with some embodiments.

The conductive contact layer 210 is made of a conductive material, such as metal (e.g., tungsten, copper, or aluminum) or an alloy thereof, in accordance with some embodiments. The conductive contact layer 210 is formed using a deposition process (e.g., a physical vapor deposition process or a chemical vapor deposition process) and a planarization process (e.g., a chemical mechanical polishing process), in accordance with some embodiments.

Figure 2C:
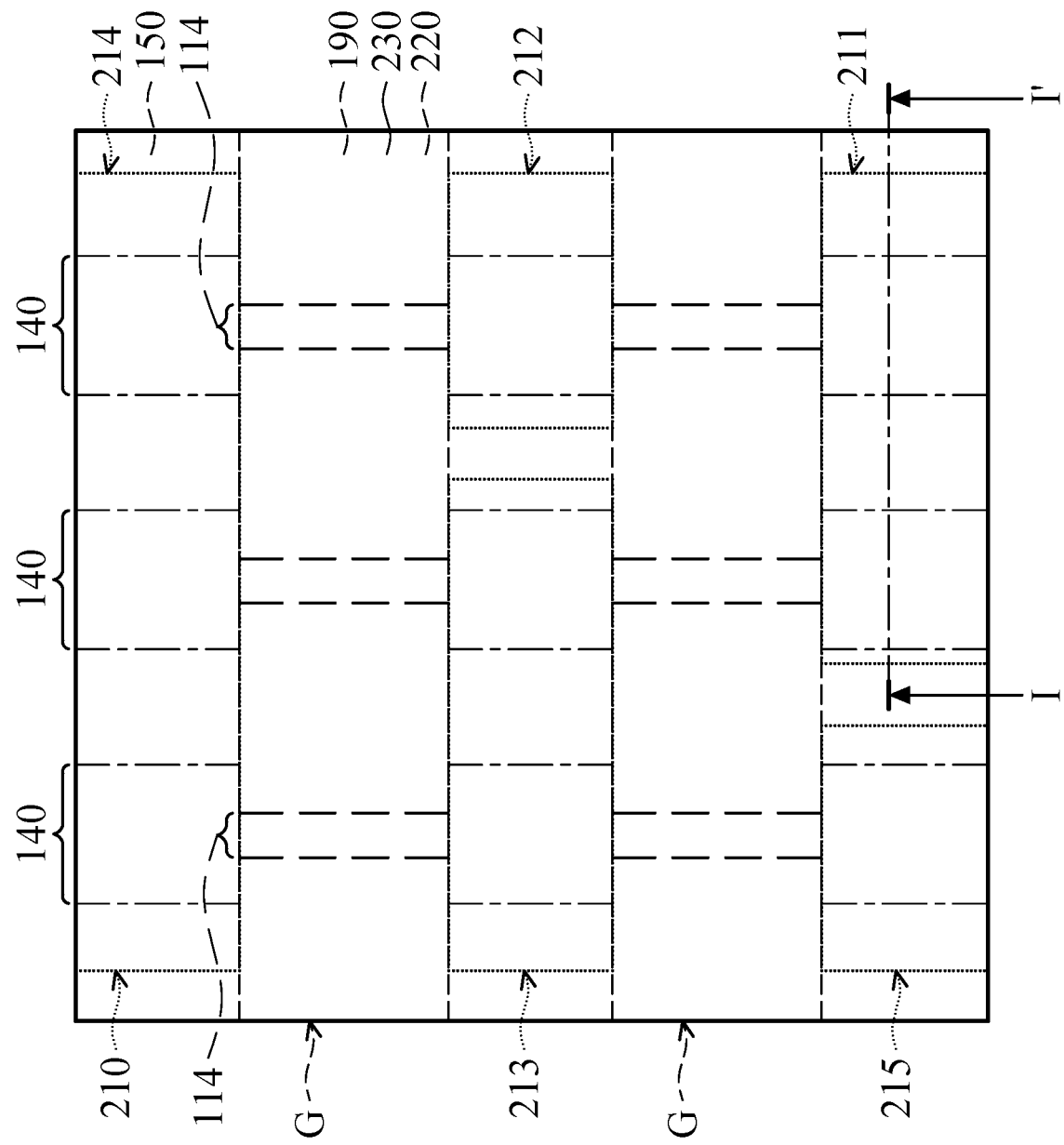
Figures 1, 2C:
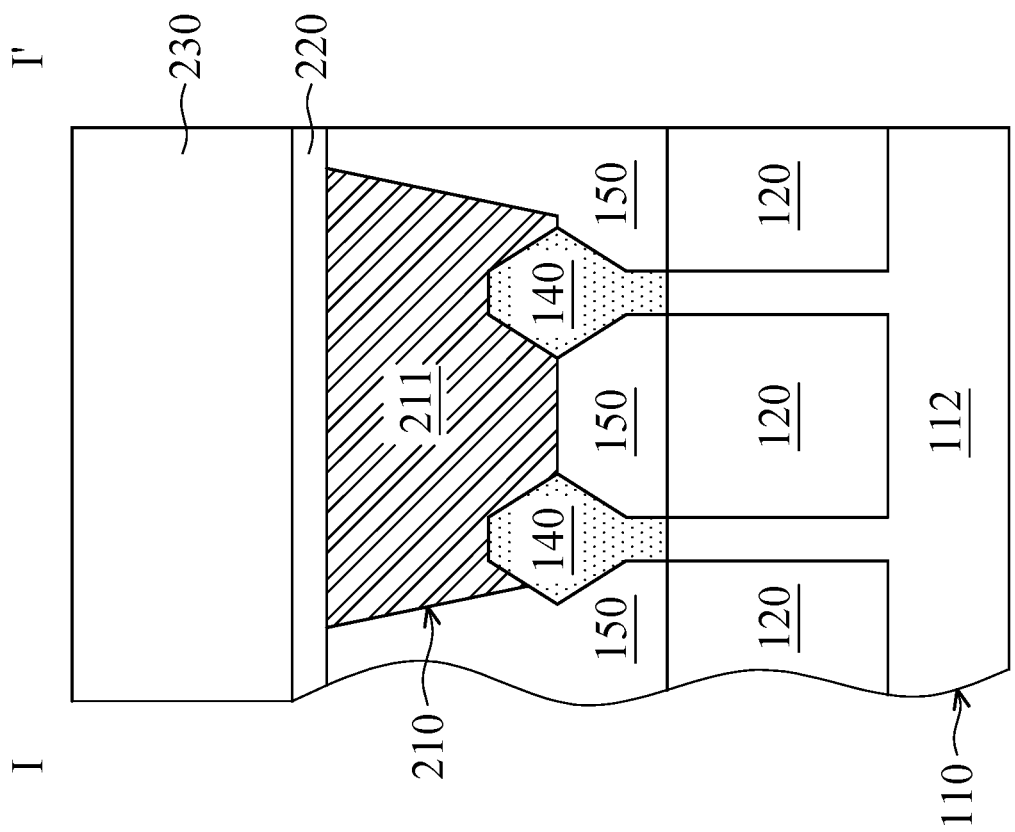

FIG. 2C-1 is a cross-sectional view illustrating the semiconductor device structure along a sectional line I-I' in FIG. 2C, in accordance with some embodiments. Afterwards, as shown in FIGS. 2C and 2C-1, an etch stop layer 220 is formed over the conductive contact layer 210, the gate stacks G, and the dielectric layer 150, in accordance with some embodiments. The etch stop layer 220 includes a dielectric material, such as silicon nitride, in accordance with some embodiments. In some other embodiments, the etch stop layer 220 is not formed.

As shown in FIGS. 2C and 2C-1, a dielectric layer 230 is deposited over the etch stop layer 220, in accordance with some embodiments. The dielectric layer 230 includes an insulating material, in accordance with some embodiments. The insulating material includes silicon oxide, borosilicate glass (BSG), phosphoric silicate glass (PSG), borophosphosilicate glass (BPSG), fluorinated silicate glass (FSG), a low-k material, a porous dielectric material, or a combination thereof, in accordance with some embodiments. The dielectric layer 230 is formed using a chemical vapor deposition (CVD) process, a high density plasma chemical vapor deposition (HDPCVD) process, a spin-on process, a sputtering process, or a combination thereof, in accordance with some embodiments.

Figure 2D:
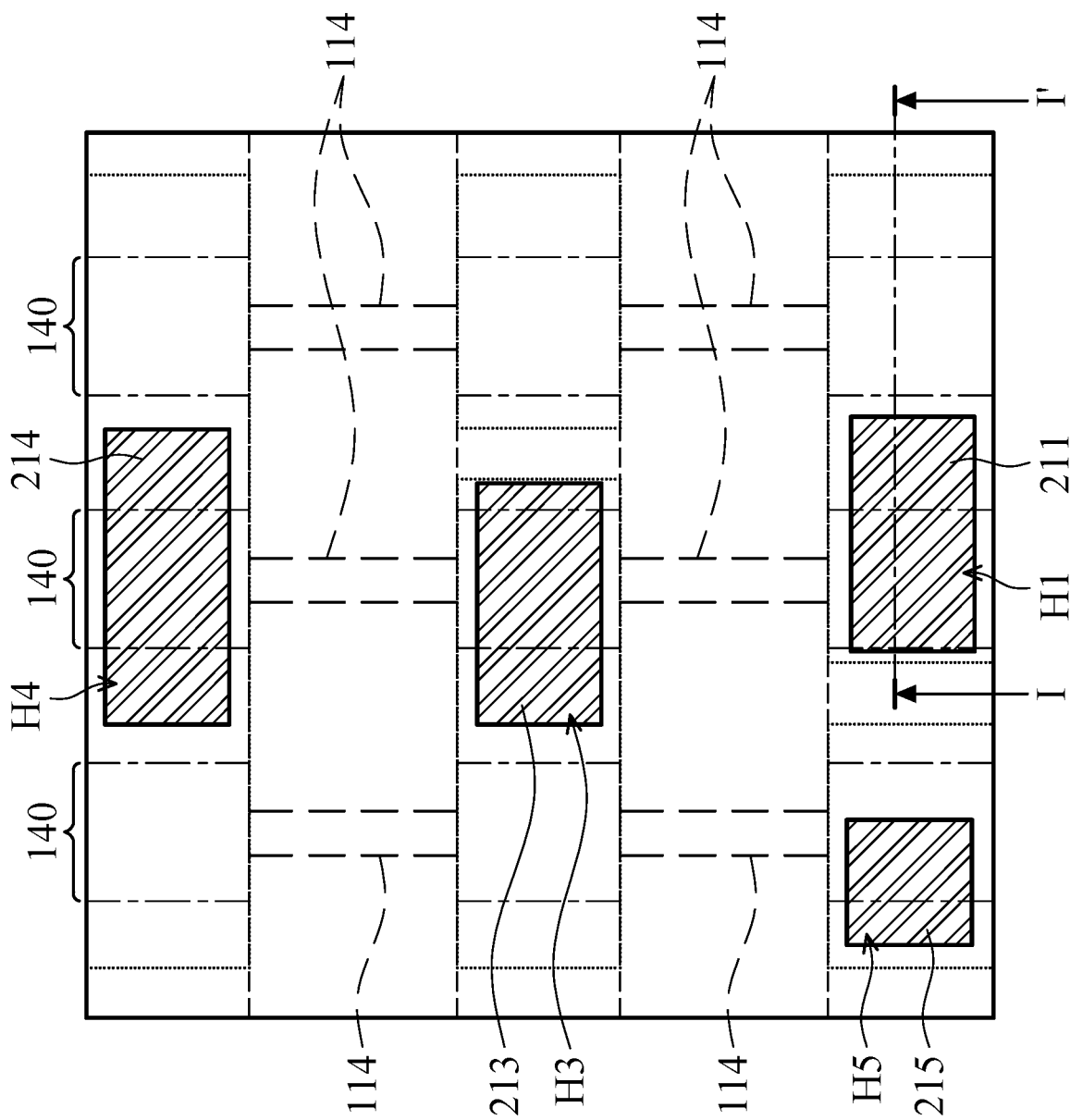
Figures 1, 2D:
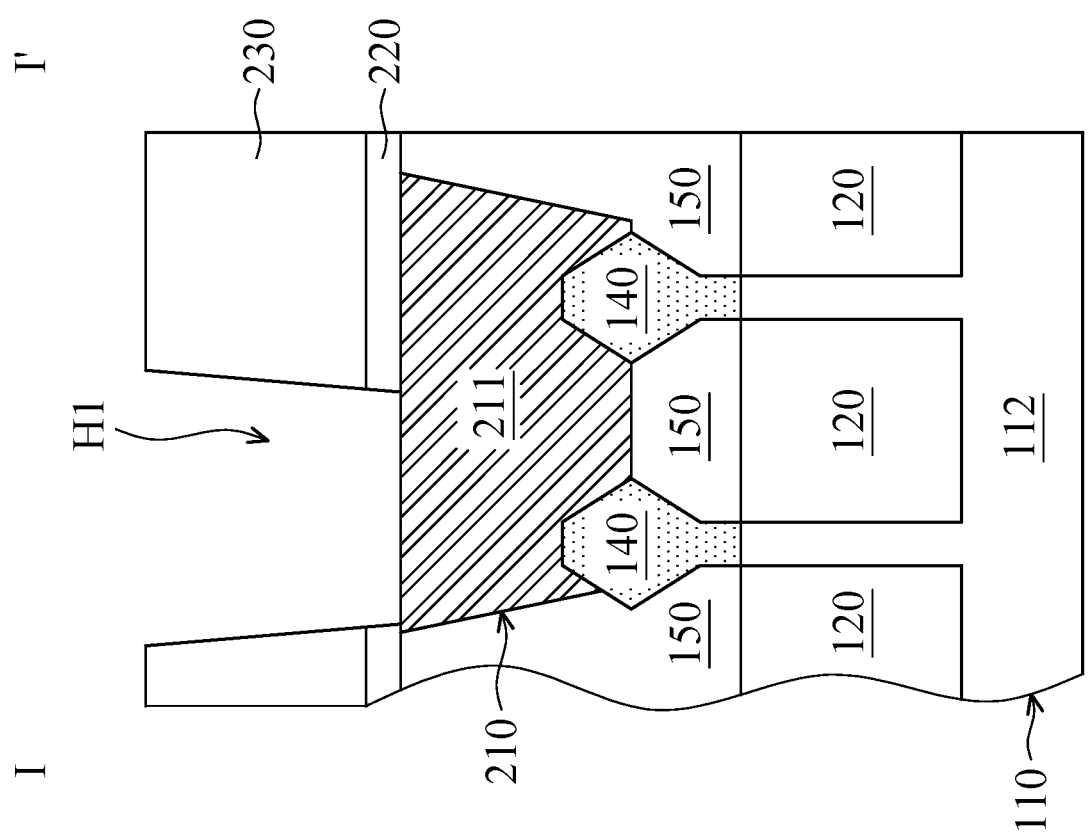

FIG. 2D-1 is a cross-sectional view illustrating the semiconductor device structure along a sectional line I-I' in FIG. 2D, in accordance with some embodiments. Afterwards, as shown in FIGS. 2D and 2D-1, the etch stop layer 220 and the dielectric layer 230 are partially removed to form through holes H1, H3, H4 and H5 in the etch stop layer 220 and the dielectric layer 230, in accordance with some embodiments.

The through hole H1 passes through the etch stop layer 220 and the dielectric layer 230 and exposes the conductive contact structure 211, in accordance with some embodiments. The through hole H3 passes through the etch stop layer 220 and the dielectric layer 230 and exposes the conductive contact structure 213, in accordance with some embodiments.

The through hole H4 passes through the etch stop layer 220 and the dielectric layer 230 and exposes the conductive contact structure 214, in accordance with some embodiments. The through hole H5 passes through the etch stop layer 220 and the dielectric layer 230 and exposes the conductive contact structure 215, in accordance with some embodiments.

The removal process includes a photolithography process and an etching process, in accordance with some embodiments. The etching process includes an anisotropic etching process, such as a dry etching process, in accordance with some embodiments.

Figure 2E:
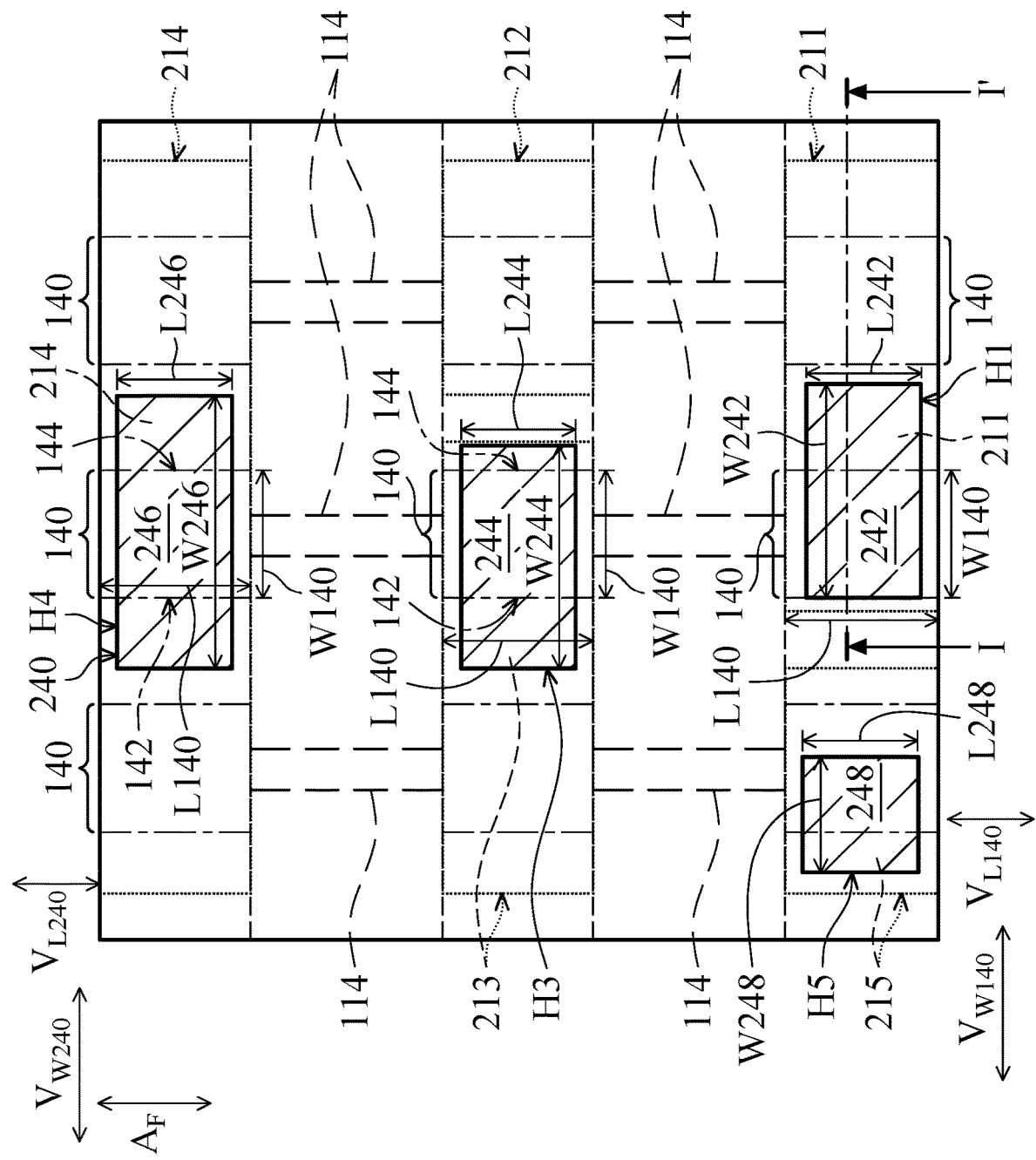
Figures 1, 2E:
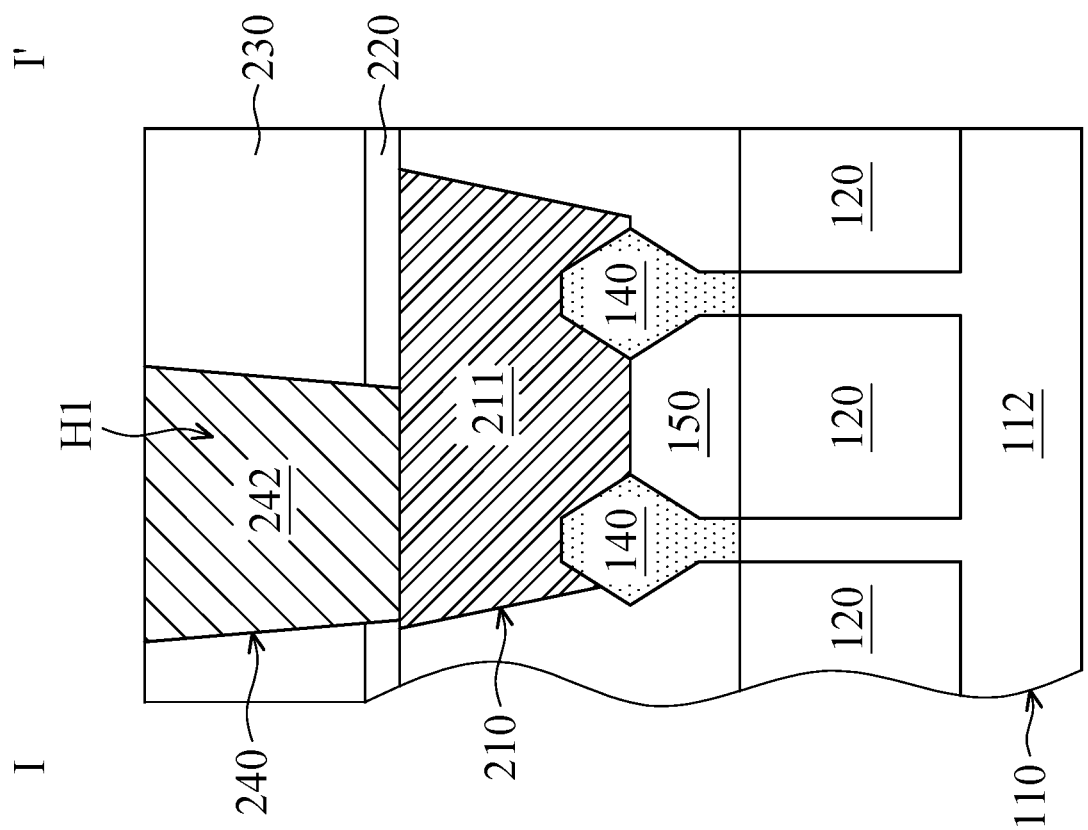

FIG. 2E-1 is a cross-sectional view illustrating the semiconductor device structure along a sectional line I-I' in FIG. 2E, in accordance with some embodiments. Afterwards, as shown in FIGS. 2E and 2E-1, a conductive layer 240 is formed in the through holes H1, H3, H4, and H5, in accordance with some embodiments. The conductive layer 240 includes conductive via structures 242, 244, 246, and 248, in accordance with some embodiments.

The conductive via structure 242 is in the through hole H1, in accordance with some embodiments. The conductive via structure 244 is in the through hole H3, in accordance with some embodiments. The conductive via structure 246 is in the through hole H4, in accordance with some embodiments. The conductive via structure 248 is in the through hole H5, in accordance with some embodiments. The conductive via structures 242, 244, 246, and 248 pass through the etch stop layer 220 and the dielectric layer 230, in accordance with some embodiments.

The conductive via structure 242 is over the conductive contact structure 211, in accordance with some embodiments. The conductive via structure 242 is narrower than the conductive contact structure 211, in accordance with some embodiments. The conductive via structure 242 is electrically connected to the conductive contact structure 211, in accordance with some embodiments. The conductive via structure 242 is in direct contact with the conductive contact structure 211, in accordance with some embodiments.

The conductive via structure 244 is over the conductive contact structure 213, in accordance with some embodiments. The conductive via structure 244 is narrower than the conductive contact structure 213, in accordance with some embodiments. The conductive via structure 244 is electrically connected to the conductive contact structure 213, in accordance with some embodiments. The conductive via structure 244 is in direct contact with the conductive contact structure 213, in accordance with some embodiments.

The conductive via structure 246 is over the conductive contact structure 214, in accordance with some embodiments. The conductive via structure 246 is narrower than the conductive contact structure 214, in accordance with some embodiments. The conductive via structure 246 is electrically connected to the conductive contact structure 214, in accordance with some embodiments. The conductive via structure 246 is in direct contact with the conductive contact structure 214, in accordance with some embodiments.

The conductive via structure 248 is over the conductive contact structure 215, in accordance with some embodiments. The conductive via structure 248 is narrower than the conductive contact structure 215, in accordance with some embodiments. The conductive via structure 248 is electrically connected to the conductive contact structure 215, in accordance with some embodiments. The conductive via structure 248 is in direct contact with the conductive contact structure 215, in accordance with some embodiments.

As shown in FIG. 2E, the conductive via structures 242, 244, and 246 have a substantially strip shape, in accordance with some embodiments. The conductive via structure 242 has a width W242 and a length L242, in accordance with some embodiments. The width W242 is greater than the length L242, in accordance with some embodiments. The length L242 ranges from about 3 nm to about 18 nm, in accordance with some embodiments.

The width W242 ranges from about 30 nm to about 200 nm, in accordance with some embodiments. If the width W242 is less than 30 nm, the contact area between the conductive via structure 242 and the conductive contact structure 211 and between the conductive via structure 242 and a conductive line subsequently formed over the conductive via structure 242 is small, which increases the contact resistance between the conductive via structure 242 and the conductive contact structure 211 and between the conductive via structure 242 and the conductive line thereover, in accordance with some embodiments. If the width W242 is greater than 200 nm, the conductive via structure 242 tends to short-circuit another conductive line subsequently formed adjacent to the conductive line over the conductive via structure 242, in accordance with some embodiments.

The conductive via structure 244 has a width W244 and a length L244, in accordance with some embodiments. The width W244 is greater than the length L244, in accordance with some embodiments. The length L244 ranges from about 3 nm to about 18 nm, in accordance with some embodiments.

The width W244 ranges from about 30 nm to about 200 nm, in accordance with some embodiments. If the width W244 is less than 30 nm, the contact area between the conductive via structure 244 and the conductive contact structure 213 and between the conductive via structure 244 and a conductive line subsequently formed over the conductive via structure 244 is small, which increases the contact resistance between the conductive via structure 244 and the conductive contact structure 213 and between the conductive via structure 244 and the conductive line thereover, in accordance with some embodiments. If the width W244 is greater than 200 nm, the conductive via structure 244 tends to short-circuit with another conductive line subsequently formed adjacent to the conductive line over the conductive via structure 244, in accordance with some embodiments.

The conductive via structure 246 has a width W246 and a length L246, in accordance with some embodiments. The width W246 is greater than the length L246, in accordance with some embodiments. The length L246 ranges from about 3 nm to about 18 nm, in accordance with some embodiments.

The width W246 ranges from about 30 nm to about 200 nm, in accordance with some embodiments. If the width W246 is less than 30 nm, the contact area between the conductive via structure 246 and the conductive contact structure 214 and between the conductive via structure 246 and a conductive line subsequently formed over the conductive via structure 246 is small, which increases the contact resistance between the conductive via structure 246 and the conductive contact structure 214 and between the conductive via structure 246 and the conductive line thereover, in accordance with some embodiments. If the width W246 is greater than 200 nm, the conductive via structure 246 tends to short-circuit with another conductive line subsequently formed adjacent to the conductive line over the conductive via structure 246, in accordance with some embodiments.

The conductive via structure 248 has a width W248 and a length L248, in accordance with some embodiments. The width W248 is substantially equal to the length L248, in accordance with some embodiments. The width W248 ranges from about 3 nm to about 18 nm, in accordance with some embodiments. The length L248 ranges from about 3 nm to about 18 nm, in accordance with some embodiments.

The conductive via structures 242, 244, 246, and 248 have the same width direction $V_{w240}$, in accordance with some embodiments. That is, the width directions of the conductive via structures 242, 244, 246, and 248 are substantially parallel to each other, in accordance with some embodiments. The width direction $V_{w240}$ is substantially perpendicular to a longitudinal axis $A_F$ of the fin structure 114, in accordance with some embodiments.

The conductive via structure 244 extends across the source/drain structure 140 thereunder, in accordance with some embodiments. Each source/drain structure 140 has two opposite sides 142 and 144, in accordance with some embodiments. The conductive via structure 244 continuously extends across the sides 142 and 144 of the source/drain structure 140 thereunder, in accordance with some embodiments.

The conductive via structure 246 extends across the source/drain structure 140 thereunder, in accordance with some embodiments. The conductive via structure 246 continuously extends across the sides 142 and 144 of the source/drain structure 140 thereunder, in accordance with some embodiments.

The width W242 of the conductive via structure 242 is greater than a width W140 of the source/drain structure 140 under the conductive via structure 242, in accordance with some embodiments. The width direction $V_{w240}$ of the conductive via structure 242 is substantially parallel to a width direction $V_{W140}$ of the source/drain structure 140 under the conductive via structure 242, in accordance with some embodiments.

The length L242 of the conductive via structure 242 is less than a length L140 of the source/drain structure 140 under the conductive via structure 242, in accordance with some embodiments. The length direction $V_{L240}$ of the conductive via structure 242 is substantially parallel to a length direction $V_{L140}$ of the source/drain structure 140 under the conductive via structure 242, in accordance with some embodiments. The length direction $V_{L240}$ or $V_{L140}$ is substantially perpendicular to the width direction $V_{w240}$ or $V_{W140}$, in accordance with some embodiments.

The width W244 of the conductive via structure 244 is greater than the width W140 of the source/drain structure 140 under the conductive via structure 244, in accordance with some embodiments. The width direction $V_{w240}$ of the conductive via structure 244 is substantially parallel to the width direction $V_{W140}$ of the source/drain structure 140 under the conductive via structure 244, in accordance with some embodiments.

The length L244 of the conductive via structure 244 is less than a length L140 of the source/drain structure 140 under the conductive via structure 244, in accordance with some embodiments. The length direction $V_{L240}$ of the conductive via structure 244 is substantially parallel to the length direction $V_{L140}$ of the source/drain structure 140 under the conductive via structure 244, in accordance with some embodiments.

The width W246 of the conductive via structure 246 is greater than the width W140 of the source/drain structure 140 under the conductive via structure 246, in accordance with some embodiments. The width direction $V_{w240}$ of the conductive via structure 246 is substantially parallel to the width direction $V_{W140}$ of the source/drain structure 140 under the conductive via structure 246, in accordance with some embodiments.

The length L246 of the conductive via structure 246 is less than a length L140 of the source/drain structure 140 under the conductive via structure 246, in accordance with some embodiments. The length direction $V_{L240}$ of the conductive via structure 246 is substantially parallel to the length direction $V_{L140}$ of the source/drain structure 140 under the conductive via structure 246, in accordance with some embodiments.

The conductive layer 240 is made of a conductive material, such as metal (e.g., tungsten, copper, or aluminum) or an alloy thereof, in accordance with some embodiments. The conductive layer 240 is formed using a deposition process (e.g., a physical vapor deposition process or a chemical vapor deposition process) and a planarization process (e.g., a chemical mechanical polishing process), in accordance with some embodiments.

Figure 2F:
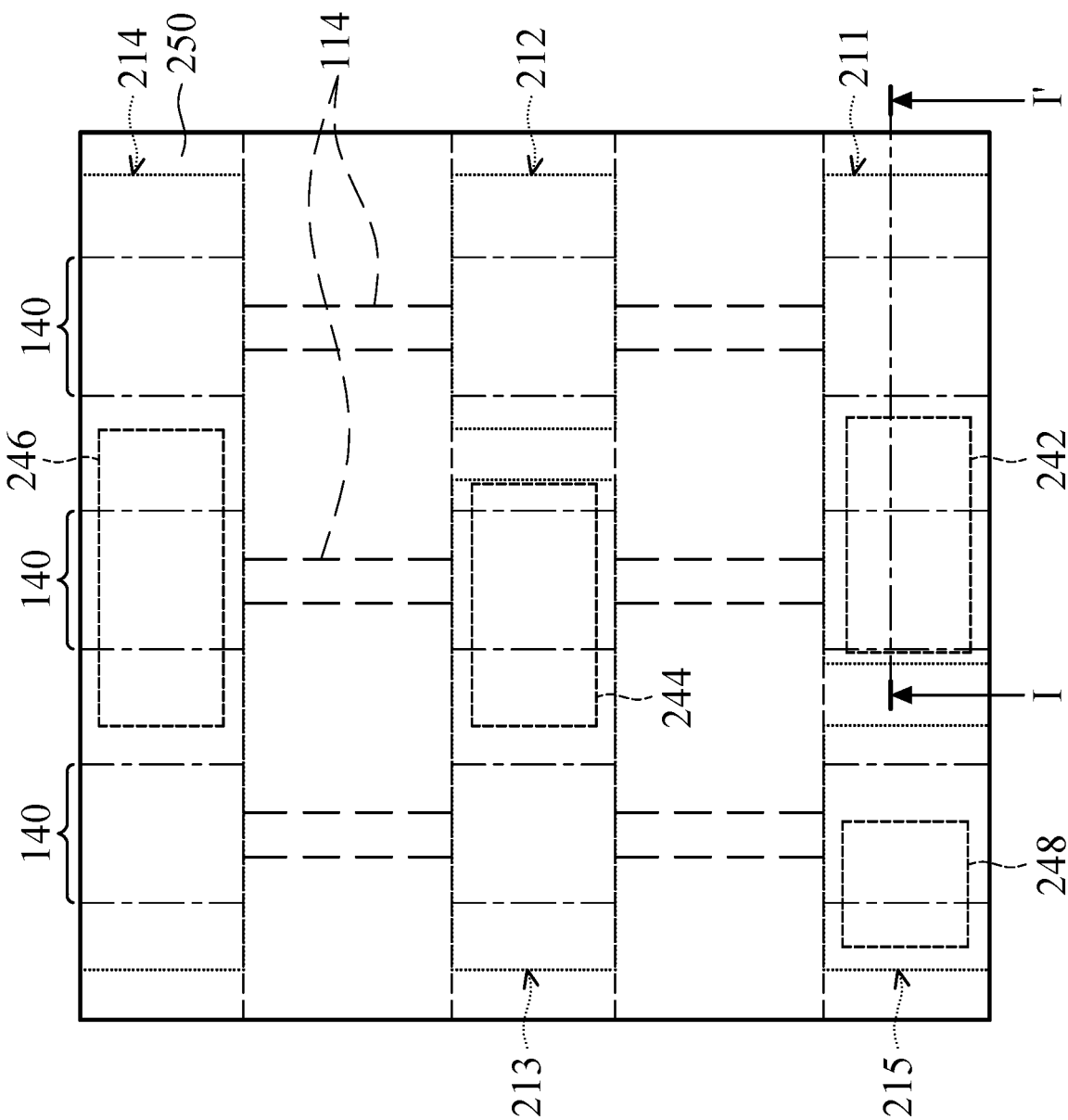
Figures 1, 2F:
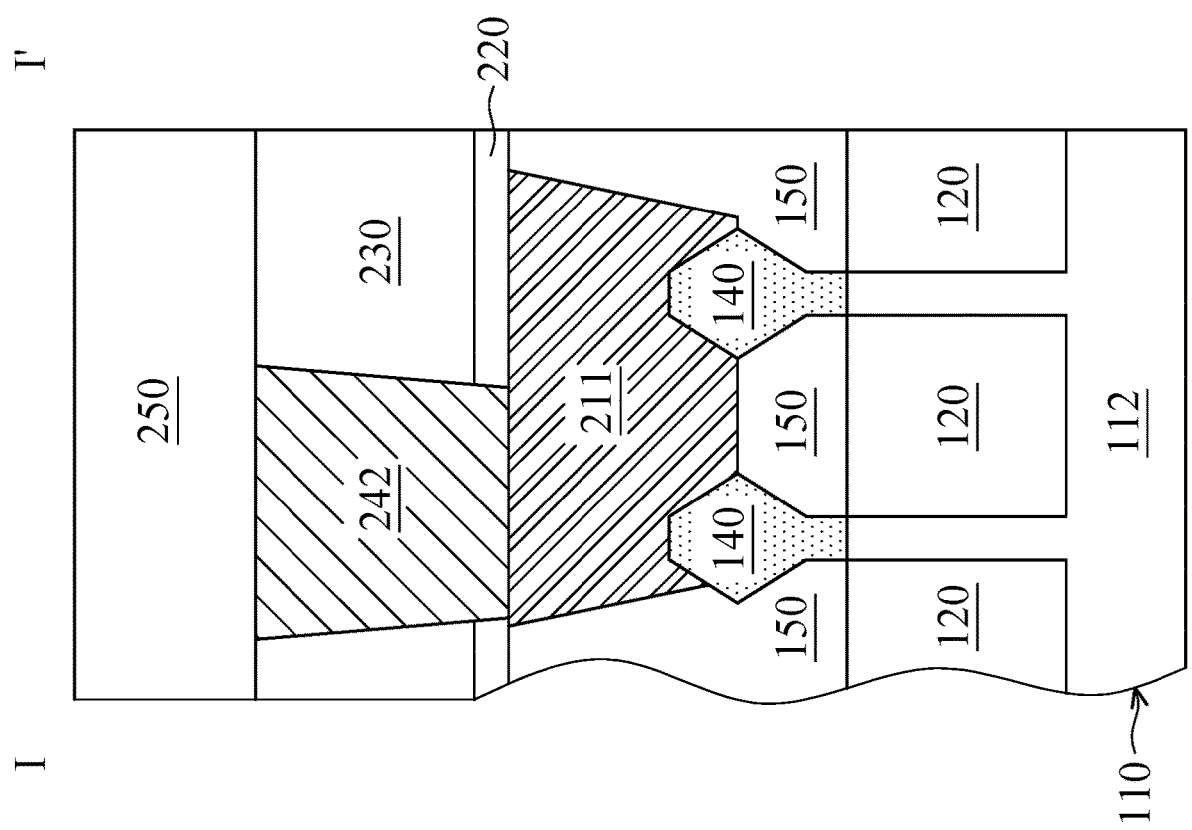

FIG. 2F-1 is a cross-sectional view illustrating the semiconductor device structure along a sectional line I-I' in FIG. 2F, in accordance with some embodiments. Afterwards, as shown in FIGS. 2F and 2F-1, a dielectric layer 250 is deposited over the dielectric layer 230 and the conductive via structures 242, 244, 246, and 248, in accordance with some embodiments.

The dielectric layer 250 includes an insulating material, in accordance with some embodiments. The insulating material includes silicon oxide, borosilicate glass (BSG), phosphoric silicate glass (PSG), borophosphosilicate glass (BPSG), fluorinated silicate glass (FSG), low-k material, porous dielectric material, or a combination thereof, in accordance with some embodiments. The dielectric layer 250 is formed using a chemical vapor deposition (CVD) process, a high density plasma chemical vapor deposition (HDPCVD) process, a spin-on process, a sputtering process, or a combination thereof, in accordance with some embodiments.

Figure 2G:
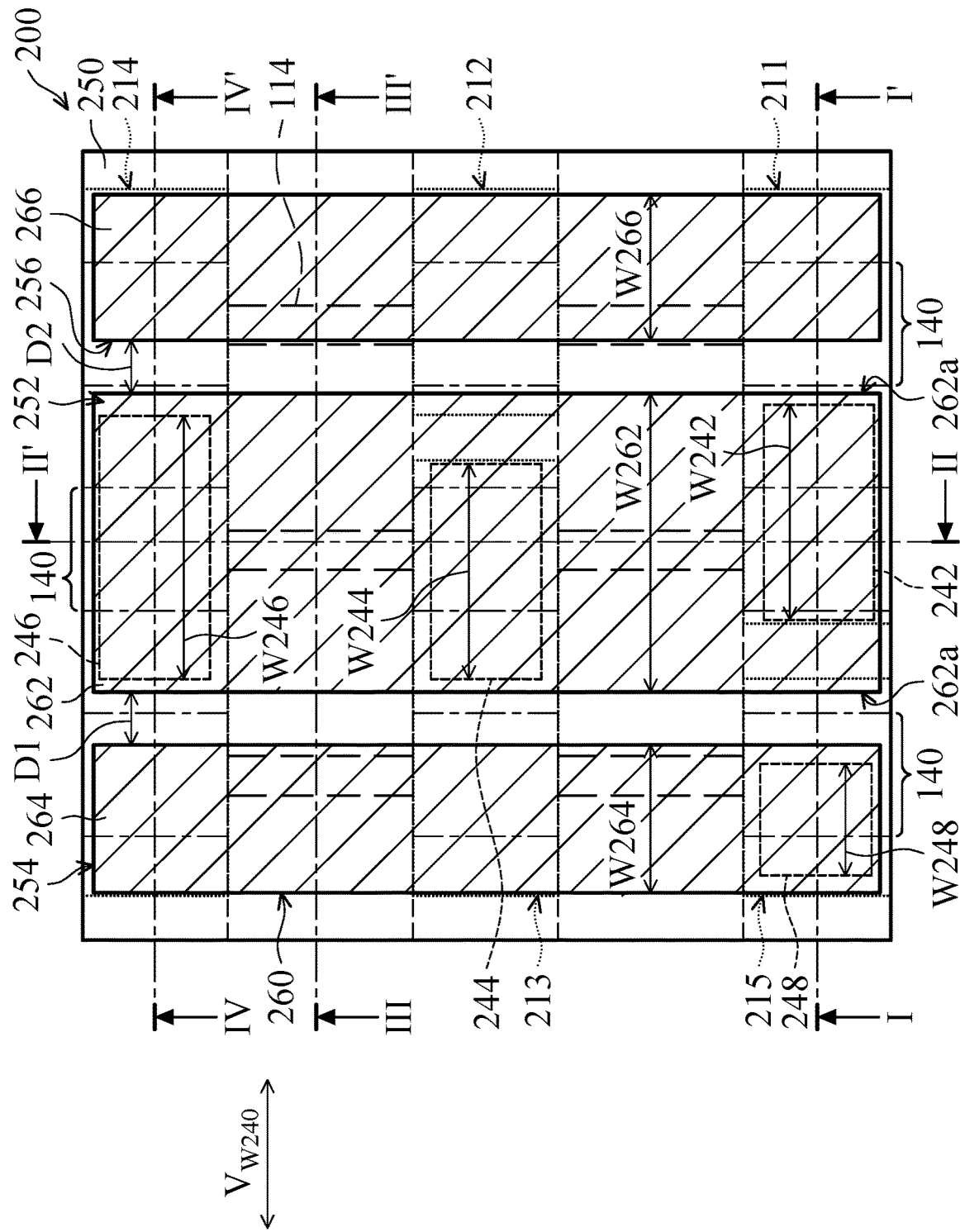
Figures 1, 2G:
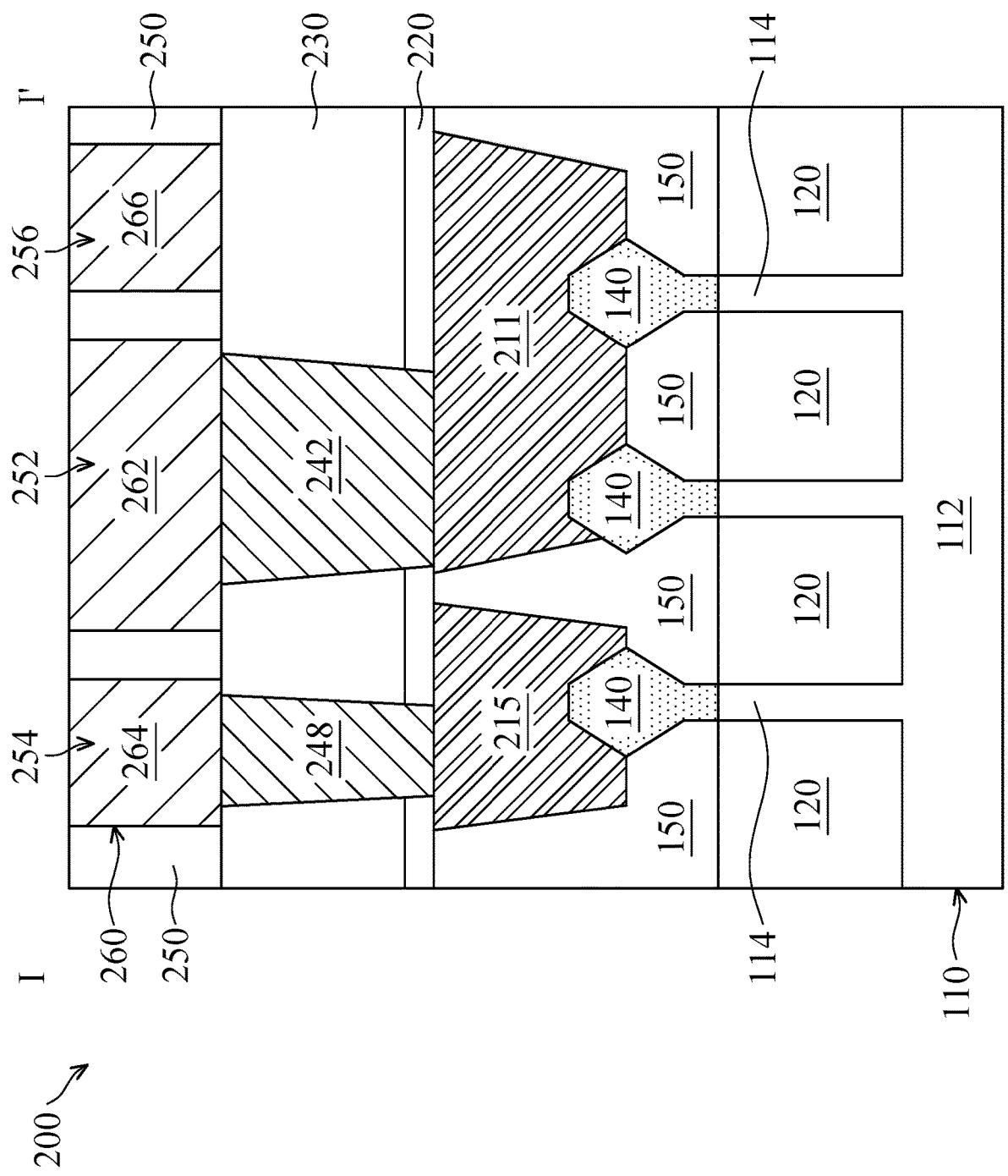
Figures 2, 2G:
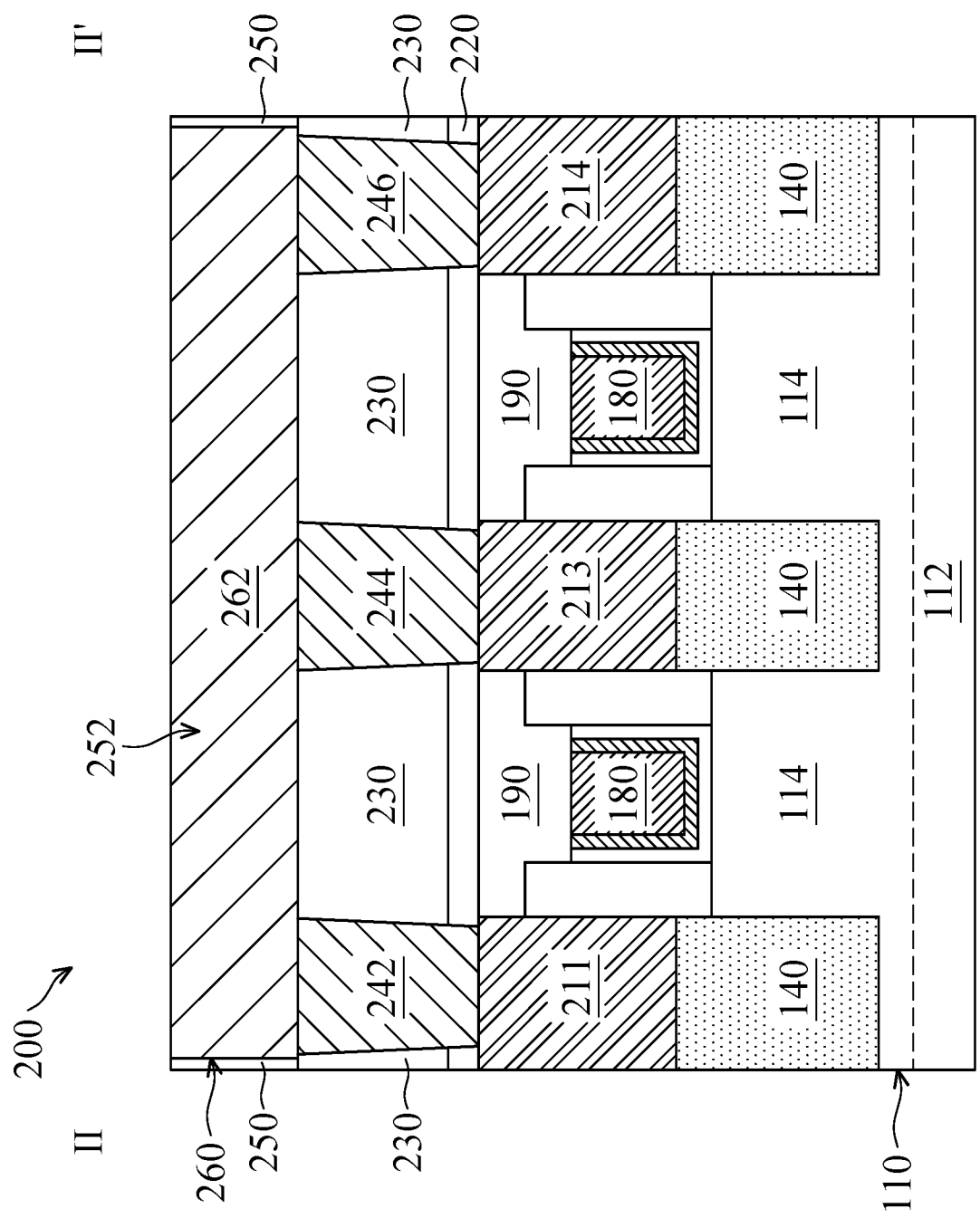
Figures 2, 2G, 3:
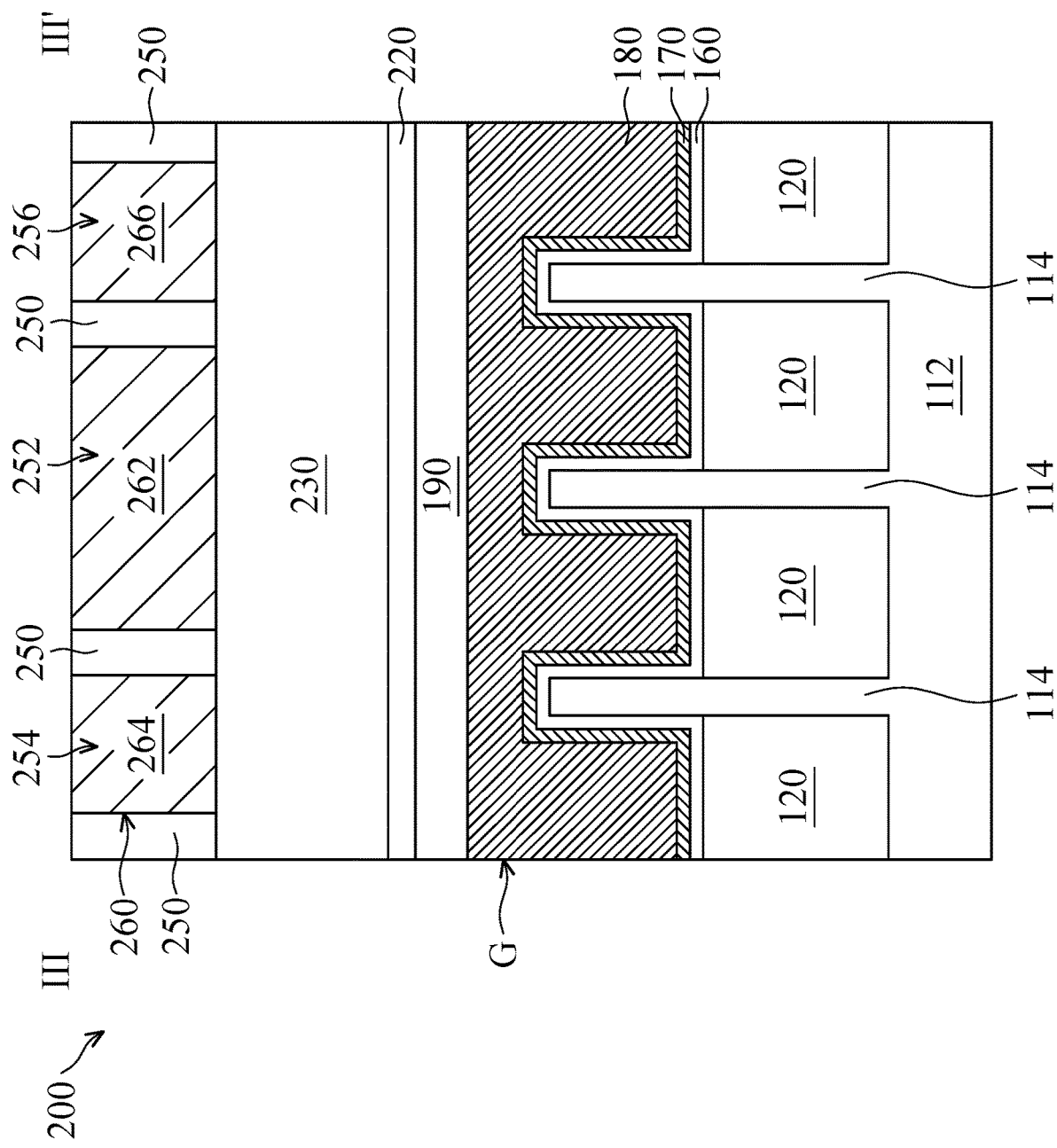
Figures 2, 2G, 3, 4:
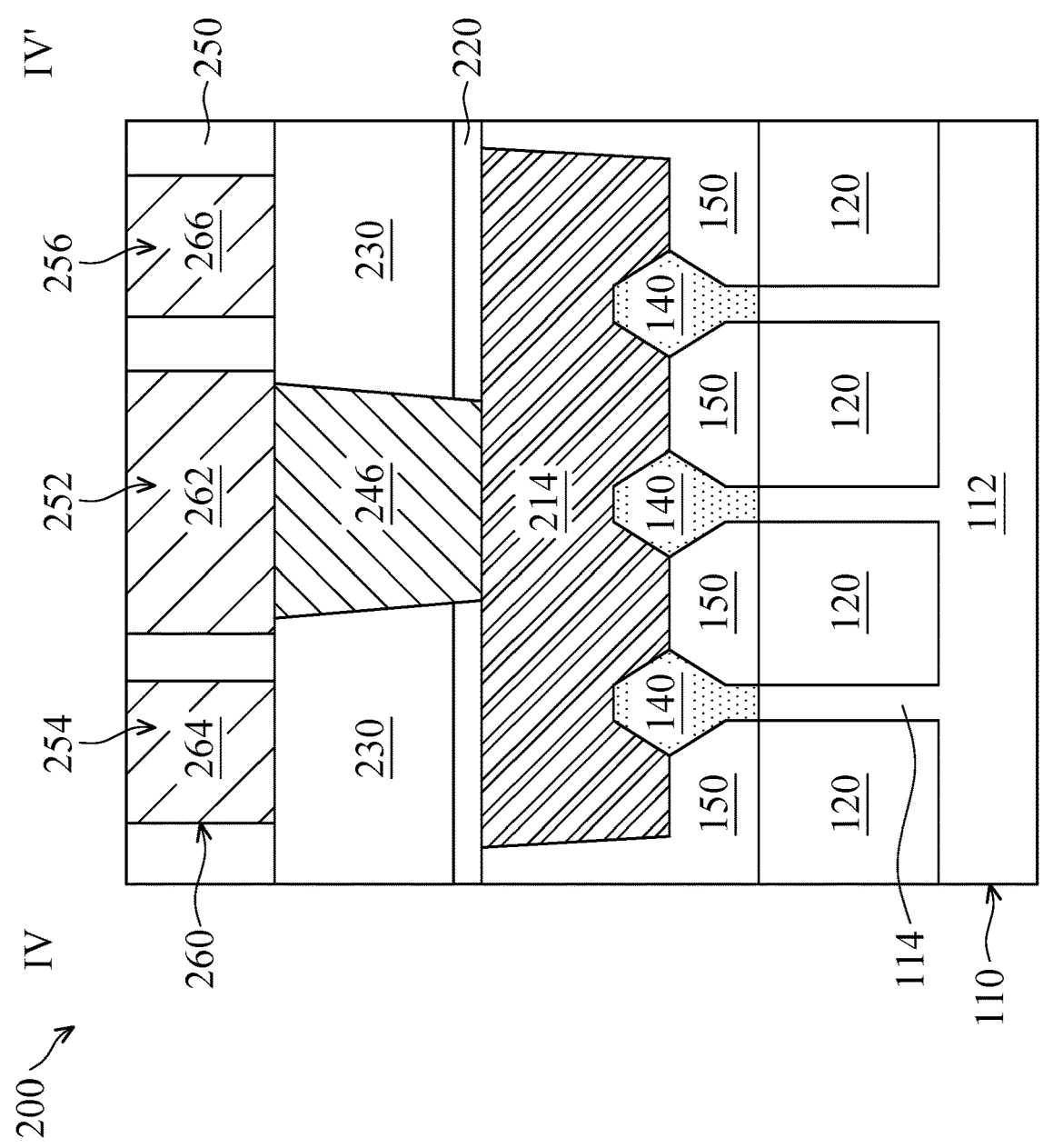

FIG. 2G-1 is a cross-sectional view illustrating the semiconductor device structure along a sectional line I-I' in FIG. 2G, in accordance with some embodiments. FIG. 2G-2 is a cross-sectional view illustrating the semiconductor device structure along a sectional line II-II' in FIG. 2G, in accordance with some embodiments. FIG. 2G-3 is a cross-sectional view illustrating the semiconductor device structure along a sectional line III-III' in FIG. 2G, in accordance with some embodiments. FIG. 2G-4 is a cross-sectional view illustrating the semiconductor device structure along a sectional line IV-IV' in FIG. 2G, in accordance with some embodiments.

Afterwards, as shown in FIGS. 2G and 2G-1, the dielectric layer 250 is partially removed to form recesses 252, 254, and 256 in the dielectric layer 250, in accordance with some embodiments. The recess 252 exposes the conductive via structures 242, 244, and 246, in accordance with some embodiments. The recess 254 exposes the conductive via structure 248, in accordance with some embodiments.

The recess 256 exposes the dielectric layer 230 thereunder, in accordance with some embodiments. The removal process includes a photolithography process and an etching process, in accordance with some embodiments. The etching process includes an anisotropic etching process, such as a dry etching process, in accordance with some embodiments.

Afterwards, as shown in FIGS. 2G and 2G-1, a conductive layer 260 is formed in the recesses 252, 254, and 256, in accordance with some embodiments. In this step, a semiconductor device structure 200 is substantially formed, in accordance with some embodiments. The conductive layer 260 includes conductive lines 262, 264, and 266, in accordance with some embodiments.

As shown in FIGS. 2G, 2G-1, 2G-2, and 2G-4, the conductive line 262 is in the recess 252 and over the conductive via structures 242, 244, and 246 and the dielectric layer 230, in accordance with some embodiments. The conductive line 262 is in direct contact with the conductive via structures 242, 244, and 246 and the dielectric layer 230, in accordance with some embodiments.

The conductive line 262 is electrically connected to the source/drain structures 140 thereunder through the conductive via structures 242, 244, and 246 and the conductive contact structures 211, 213, and 214, in accordance with some embodiments. The conductive via structures 242, 244, and 246, the conductive contact structures 211, 213, and 214, and the source/drain structures 140 thereunder are electrically connected to each other through the conductive line 262, in accordance with some embodiments.

As shown in FIGS. 2G, 2G-1, and 2G-3, the conductive line 264 is in the recess 254 and over the conductive via structure 248 and the dielectric layer 230, in accordance with some embodiments. The conductive line 264 is in direct contact with the conductive via structure 248 and the dielectric layer 230, in accordance with some embodiments.

The conductive line 264 is electrically connected to the source/drain structure 140 thereunder through the conductive via structure 248 and the conductive contact structure 215, in accordance with some embodiments. As shown in FIGS. 2G and 2G-1, the conductive line 266 is in the recess 256 and over the dielectric layer 230, in accordance with some embodiments.

The conductive line 262 is used as a power rail, in accordance with some embodiments. As shown in FIG. 2G, a line width W262 of the conductive line 262 is greater than a line width W264 of the conductive line 264, in accordance with some embodiments. The line width W262 of the conductive line 262 is greater than the width W242 of the conductive via structure 242, in accordance with some embodiments.

The line width W262 of the conductive line 262 is greater than the width W244 of the conductive via structure 244, in accordance with some embodiments. The line width W262 of the conductive line 262 is greater than the width W246 of the conductive via structure 246, in accordance with some embodiments.

The width direction $V_{W240}$ of the conductive via structure 242, 244, or 246 is substantially perpendicular to sidewalls 262a of the conductive line 262 close to the conductive via structure 242, 244, or 246, in accordance with some embodiments.

The line width W262 of the conductive line 262 is greater than a line width W266 of the conductive line 266, in accordance with some embodiments. The line width W262 ranges from about 30 nm to about 200 nm, in accordance with some embodiments. The line width W264 ranges from about 5 nm to about 30 nm, in accordance with some embodiments. The line width W266 ranges from about 5 nm to about 30 nm, in accordance with some embodiments.

In some embodiments, a distance D1 between the conductive lines 262 and 264 is substantially equal to a distance D2 between the conductive lines 262 and 266. In some other embodiments, the distance D1 is different from the distance D2. The distance D1 ranges from about 5 nm to about 200 nm, in accordance with some embodiments. The distance D2 ranges from about 5 nm to about 200 nm, in accordance with some embodiments.

The conductive layer 260 is made of a conductive material, such as metal (e.g., tungsten, copper, or aluminum) or an alloy thereof, in accordance with some embodiments. The conductive layer 260 is formed using a deposition process (e.g., a physical vapor deposition process or a chemical vapor deposition process) and a planarization process (e.g., a chemical mechanical polishing process), in accordance with some embodiments.

As shown in FIG. 2G, since the conductive via structures 242, 244, and 246 have a substantially strip shape, the contact area between the conductive via structures 242, 244, and 246 and the conductive contact structures 211, 213, and 214 and the contact area between the conductive via structures 242, 244, and 246 and the conductive line 262 are both enlarged, in accordance with some embodiments.

Therefore, the contact resistance between the conductive via structures 242, 244, and 246 and the conductive contact structures 211, 213, and 214 and the contact resistance between the conductive via structures 242, 244, and 246 and the conductive line 262 are decreased, in accordance with some embodiments. As a result, the performance of the semiconductor device structure 200 with the conductive via structures 242, 244, and 246 is improved, in accordance with some embodiments.

Figure 3A:
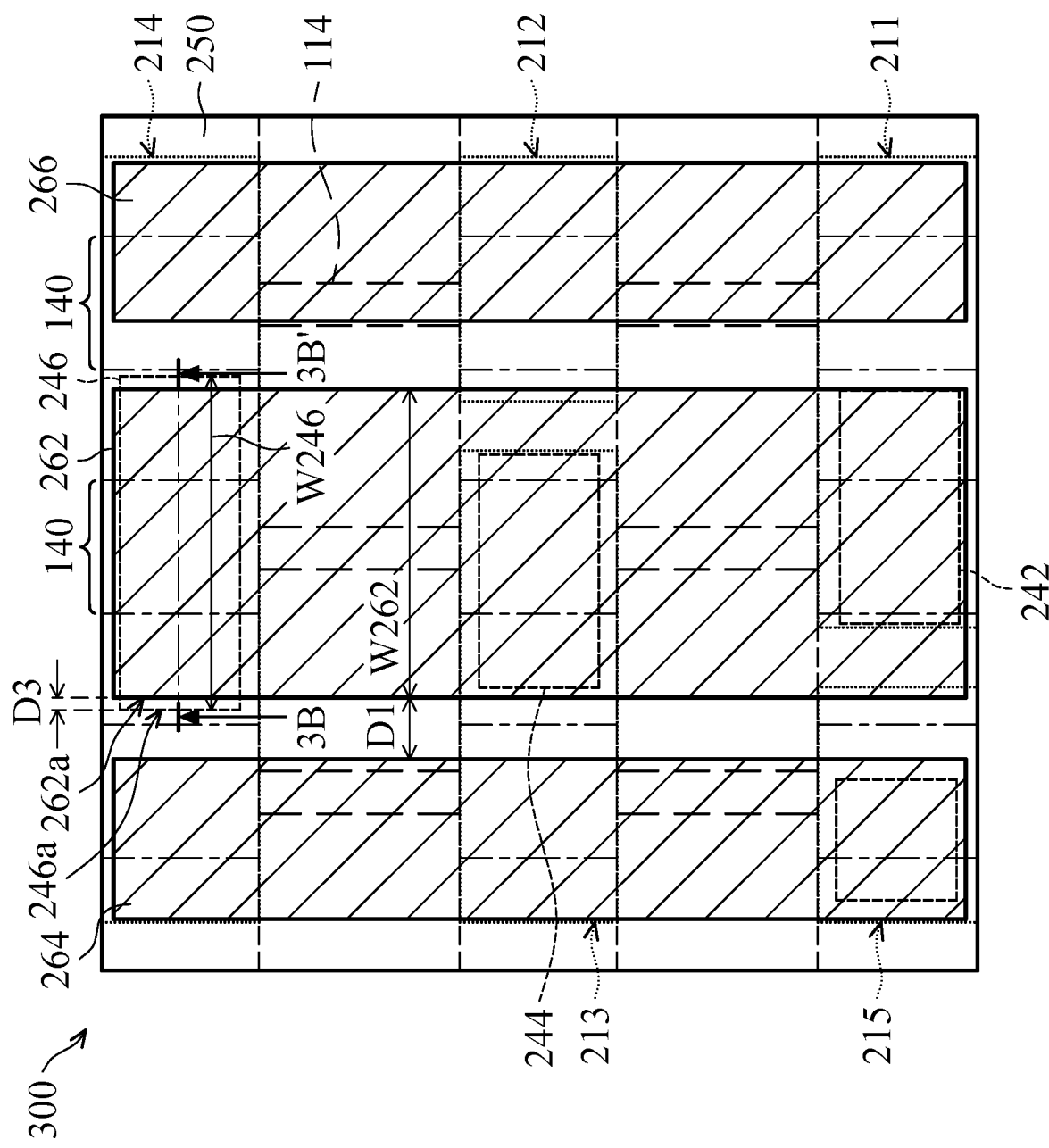
FIG. 3A is a top view of a semiconductor device structure, in accordance with some embodiments.
Figure 3B:
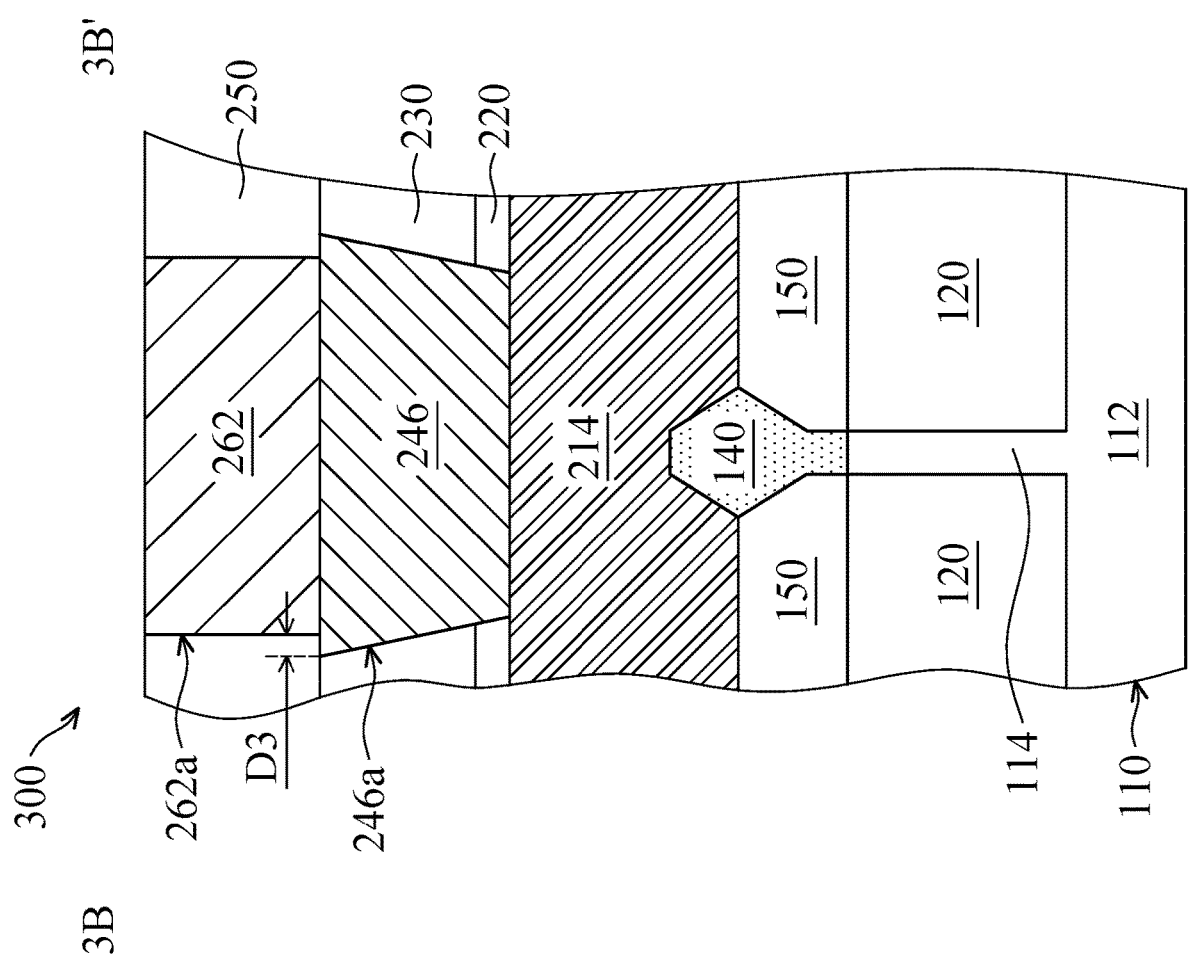
FIG. 3B is a cross-sectional view illustrating the semiconductor device structure along a sectional line 3B-3B' in FIG. 3A, in accordance with some embodiments.
Figure 4:
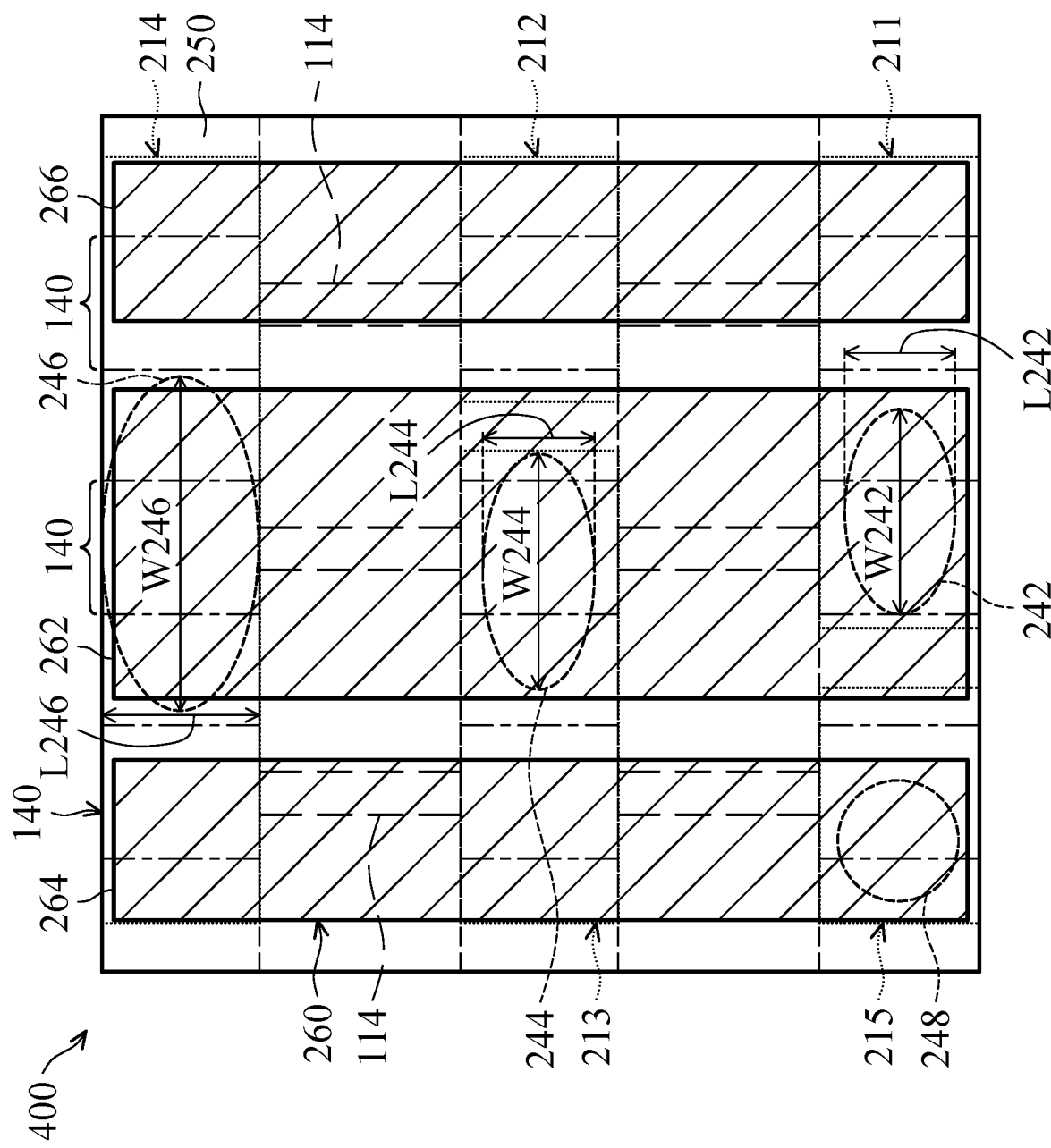

FIG. 3A is a top view of a semiconductor device structure 300, in accordance with some embodiments. FIG. 3B is a cross-sectional view illustrating the semiconductor device structure 300 along a sectional line 3B-3B' in FIG. 3A, in accordance with some embodiments.

As shown in FIGS. 3A and 3B, the semiconductor device structure 300 is similar to the semiconductor device structure 200 of FIG. 2G, except that the width W246 of the conductive via structure 246 is greater than the line width W262 of the conductive line 262, in accordance with some embodiments.

The sidewall 262a of the conductive line 262 is spaced apart from a sidewall 246a of the conductive via structure 246 by a distance D3, in accordance with some embodiments. In some embodiments, a ratio of the distance D3 to the distance D1 (between the conductive lines 262 and 264) is less than 0.5. If the ratio (D3/D1) is greater than 0.5, the conductive via structure 246 tends to short-circuit with the conductive line 264, in accordance with some embodiments.

FIG. 4 is a top view of a semiconductor device structure 400, in accordance with some embodiments. As shown in FIG. 4, the semiconductor device structure 400 is similar to the semiconductor device structure 300 of FIG. 3A, except that the conductive via structures 242, 244, and 246 have a substantially oval shape and the conductive via structure 248 has a substantially round shape, in accordance with some embodiments.

The width W242 of the conductive via structure 242 is greater than the length L242 of the conductive via structure 242, in accordance with some embodiments. The width W244 of the conductive via structure 244 is greater than the length L244 of the conductive via structure 244, in accordance with some embodiments. The width W246 of the conductive via structure 246 is greater than the length L246 of the conductive via structure 246, in accordance with some embodiments.

The width W246 is greater than the width W244, and the width W244 is greater than the width W242, in accordance with some embodiments. The length L246 is greater than the length L244, and the length L244 is greater than the length L242, in accordance with some embodiments.

Processes and materials for forming the semiconductor device structures 300 and 400 may be similar to, or the same as, those for forming the semiconductor device structure 200 described above. Elements designated by the same reference numbers as those in FIGS. 1 to 4 have the structures and the materials similar thereto or the same thereas. Therefore, the detailed descriptions thereof will not be repeated herein.

In accordance with some embodiments, semiconductor device structures and methods for forming the same are provided. The methods (for forming the semiconductor device structure) form a conductive via structure between a conductive contact structure and a conductive line. The conductive via structure has a substantially strip shape, which enlarge the contact area between the conductive via structure and the conductive contact structure and the contact area between the conductive via structure and the conductive line. Therefore, the contact resistance between the conductive via structure and the conductive contact structure and the contact resistance between the conductive via structure and the conductive line are decreased. As a result, the performance of the semiconductor device structure with the conductive via structure is improved.

In accordance with some embodiments, a semiconductor device structure is provided. The semiconductor device structure includes a substrate having a first fin structure. The semiconductor device structure includes a first source/drain structure over the first fin structure. The semiconductor device structure includes a first dielectric layer over the first source/drain structure and the substrate. The semiconductor device structure includes a first conductive contact structure in the first dielectric layer and over the first source/drain structure. The semiconductor device structure includes a second dielectric layer over the first dielectric layer and the first conductive contact structure. The semiconductor device structure includes a first conductive via structure passing through the second dielectric layer and connected to the first conductive contact structure. The first conductive via structure has a first substantially strip shape in a top view of the first conductive via structure.

In accordance with some embodiments, a semiconductor device structure is provided. The semiconductor device structure includes a substrate having a fin structure. The semiconductor device structure includes an source/drain structure over the fin structure. The semiconductor device structure includes a first dielectric layer over the source/drain structure and the substrate. The semiconductor device structure includes a conductive contact structure passing through the first dielectric layer and over the source/drain structure. The semiconductor device structure includes a second dielectric layer over the first dielectric layer and the conductive contact structure. The semiconductor device structure includes a conductive via structure passing through the second dielectric layer and connected to the conductive contact structure. The conductive via structure has a first width and a length, and the first width is greater than the length in a top view of the conductive via structure.

In accordance with some embodiments, a method for forming a semiconductor device structure is provided. The method includes providing a substrate having a fin structure. The method includes forming a source/drain structure over the fin structure. The method includes forming a conductive contact structure over the source/drain structure. The method includes forming a conductive via structure over the conductive contact structure. The conductive via structure has a substantially strip shape in a top view of the conductive via structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
    a substrate having a first fin structure;
    a first source/drain structure over the first fin structure;
    a first dielectric layer over the first source/drain structure and the substrate;
    a first conductive contact structure in the first dielectric layer and over the first source/drain structure, and the first conductive contact structure has a substantially strip shape in a top view of the first conductive contact structure;
    a second dielectric layer over the first dielectric layer and the first conductive contact structure;
    a first conductive via structure passing through the second dielectric layer and connected to the first conductive contact structure, wherein the first conductive via structure has a first substantially strip shape in a top view of the first conductive via structure; and
    a first conductive line over the first conductive via structure and the second dielectric layer, wherein the first conductive line is electrically connected to the first source/drain structure through the first conductive contact structure and the first conductive via structure.

2. The semiconductor device structure as claimed in claim 1, wherein the first conductive via structure is in direct contact with the first conductive contact structure.

3. The semiconductor device structure as claimed in claim 2, wherein the first conductive contact structure wraps around an upper portion of the first source/drain structure.

4. The semiconductor device structure as claimed in claim 3, wherein the first conductive contact structure is in direct contact with the first source/drain structure.

5. The semiconductor device structure as claimed in claim 1, wherein a width of the first conductive via structure is greater than a length of the first conductive via structure in the top view of the first conductive via structure, and a width direction of the first conductive via structure is substantially perpendicular to a longitudinal axis of the first fin structure.

6. The semiconductor device structure as claimed in claim 1, wherein the first source/drain structure has a first side and a second side, the second side is opposite to the first side, and the first conductive via structure continuously extends across the first side and the second side.

7. The semiconductor device structure as claimed in claim 1, wherein a width of the first conductive via structure is greater than a length of the first conductive via structure in the top view of the first conductive via structure, and a width direction of the first conductive via structure is substantially perpendicular to a sidewall of the first conductive line close to the first conductive via structure.

8. The semiconductor device structure as claimed in claim 1, wherein the substrate further has a second fin structure, and the semiconductor device structure further comprises:
    a second source/drain structure over the second fin structure, wherein the first dielectric layer is further over the second source/drain structure, and the first conductive line is further electrically connected to the second source/drain structure.

9. The semiconductor device structure as claimed in claim 8, wherein the first fin structure is connected to the second fin structure.

10. The semiconductor device structure as claimed in claim 8, further comprising:
    a second conductive contact structure in the first dielectric layer and over the second source/drain structure, wherein the second dielectric layer is further over the second conductive contact structure; and
    a second conductive via structure passing through the second dielectric layer and connected to the second conductive contact structure, wherein the second conductive via structure has a second substantially strip shape in a top view of the second conductive via structure.

11. The semiconductor device structure as claimed in claim 10, wherein in a top view of the first conductive via structure and the second conductive via structure, a first width of the first conductive via structure is greater than a first length of the first conductive via structure, a second width of the second conductive via structure is greater than a second length of the second conductive via structure, and a first width direction of the first conductive via structure is substantially parallel to a second width direction of the second conductive via structure.

12. A semiconductor device structure, comprising:
    a substrate having a fin structure;
    an source/drain structure over the fin structure;
    a first dielectric layer over the source/drain structure and the substrate;
    a conductive contact structure passing through the first dielectric layer and over the source/drain structure;
    a second dielectric layer over the first dielectric layer and the conductive contact structure;
    a conductive via structure passing through the second dielectric layer and connected to the conductive contact structure, wherein the conductive via structure has a first width and a first length, the first width is greater than the first length in a top view of the conductive via structure, and
    a second width of the conductive contact structure is greater than a second length of the conductive contact structure in a top view of the conductive contact structure;
    a first conductive line over the conductive via structure and the second dielectric layer, wherein the first conductive line is electrically connected to the source/drain structure through the conductive contact structure and the conductive via structure; and
    a second conductive line over the second dielectric layer, wherein a first line width of the first conductive line is greater than a second line width of the second conductive line.

13. The semiconductor device structure as claimed in claim 12, wherein the conductive via structure has a substantially oval shape.

14. The semiconductor device structure as claimed in claim 12, wherein the first width of the conductive via structure is greater than a third width of the source/drain structure, and a first width direction of the conductive via structure is substantially parallel to a second width direction of the source/drain structure.

15. The semiconductor device structure as claimed in claim 12, wherein a first direction of the first width is substantially perpendicular to a longitudinal axis of the fin structure, and a second direction of the first length is substantially parallel to the longitudinal axis of the fin structure.

16. A method for forming a semiconductor device structure, comprising:

providing a substrate having a fin structure;

forming a source/drain structure over the fin structure;

forming a first dielectric layer over the source/drain structure and the substrate;

forming a conductive contact structure in the first dielectric layer and over the source/drain structure, wherein the conductive contact structure has a first substantially strip shape in a top view of the conductive contact structure;

forming a second dielectric layer over the first dielectric layer and the conductive contact structure;

forming a conductive via structure passing through the second dielectric layer and connected to the conductive contact structure, wherein the conductive via structure has a second substantially strip shape in a top view of the conductive via structure; and forming a first conductive line over the conductive via structure and the second dielectric layer, wherein the first conductive line is electrically connected to the source/drain structure through the conductive contact structure and the conductive via structure.

17. The method for forming the semiconductor device structure as claimed in claim 16, wherein the conductive via structure is in direct contact with the conductive contact structure.

18. The method for forming the semiconductor device structure as claimed in claim 16, wherein the conductive via structure extends across the source/drain structure.

19. The method for forming the semiconductor device structure as claimed in claim 16, further comprising:

forming a second conductive line over the second dielectric layer, wherein a first line width of the first conductive line is greater than a second line width of the second conductive line.

20. The method for forming the semiconductor device structure as claimed in claim 16, wherein the first conductive line overlaps the conductive via structure, the conductive contact structure, and the source/drain structure.

\* \* \* \* \*